(12) United States Patent
Honda et al.

(10) Patent No.: US 7,221,525 B2
(45) Date of Patent: May 22, 2007

(54) DRIVE APPARATUS, LENS UNIT, AND CAMERA

(75) Inventors: Katsuyuki Honda, Suwa (JP); Shoichi Nagao, Suwa (JP); Hiroyuki Mukaiyama, Suwa (JP); Akihiro Shimizu, Suwa (JP); Akira Komatsu, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 80 days.

(21) Appl. No.: 11/032,162

(22) Filed: Jan. 7, 2005

(65) Prior Publication Data

US 2005/0185947 A1 Aug. 25, 2005

(30) Foreign Application Priority Data

Jan. 13, 2004 (JP) ............................. 2004-005562
Jul. 9, 2004 (JP) ............................. 2004-203554

(51) Int. Cl.
*G02B 7/02* (2006.01)

(52) U.S. Cl. ....................................... 359/824; 359/819

(58) Field of Classification Search ................ 359/824, 359/823, 822, 819, 811, 694, 699, 700
See application file for complete search history.

(56) References Cited

U.S. PATENT DOCUMENTS 5,675,444 A 10/1997 Ueyama et al.
6,091,552 A * 7/2000 Ueyama ...................... 359/694
2002/0015234 A1 2/2002 Suzuki et al.
2002/0075571 A1* 6/2002 Chikami et al. ............ 359/694
2004/0020279 A1* 2/2004 Degertekin et al. ........... 73/105

FOREIGN PATENT DOCUMENTS

| JP | 04-069070 | 3/1992 |
| JP | 07-274546 | 10/1995 |
| JP | 08-066068 | 3/1996 |
| JP | 10-161001 | 6/1998 |

* cited by examiner

*Primary Examiner*—Timothy Thompson

(57) ABSTRACT

A drive apparatus improves drive efficiency while reducing device size, and a lens unit and a camera using the drive apparatus. A cam member is driven rotationally by vibration of an oscillator in the lens unit and thereby causes lenses to move forward and backward. The construction and operation of the drive apparatus supplants the need for a complicated drive mechanism using an electromagnetic motor and incumbent gears or cam rings. The simplified drive apparatus enables the device in which it is embodied to be made compact. Driving the lenses by means of a cam member minimizes energy loss due to friction, and thus sufficiently improves drive efficiency.

16 Claims, 19 Drawing Sheets

(A)

(B)

(A)

(B)

(A)

(B)

DRIVE APPARATUS, LENS UNIT, AND CAMERA

BACKGROUND OF THE INVENTION

1. Field of the Invention

The present invention relates generally to a drive apparatus, a lens unit, and a camera. More particularly, the present invention relates to a drive apparatus for driving a driven member by means of an oscillator using a piezoelectric element, and to a lens unit employing a lens drive mechanism for driving a lens using such a drive apparatus where the lens unit is used in a film camera, digital camera, video camera, microscope, binoculars, or other such products. The invention also relates to a camera, such as any of those identified above, employing a lens drive mechanism for driving a lens by means of the above-identified drive apparatus.

2. Description of the Related Art

Devices for driving movable parts in cameras and other such precision products normally use the drive force produced by an electromagnetic motor. See, for example, Japanese Unexamined Patent Appl. Pub. H10-161001, pages 3 to 4. The lens drive apparatus as taught in H10-161001 connects a plurality of lens groups, which are driven members, located inside the lens unit, to an electromagnetic motor disposed outside the lens unit by means of gears and cam rings. The gears and cam rings rotate in conjunction with the rotation of the drive shaft of the motor, and this rotation causes the lens groups to travel in an out along the optical axis for zooming and focusing.

The problem with such an electromagnetic-motor-driven drive apparatus is that, while the drive apparatus produces high drive power, the electromagnetic motor itself is relatively large and must be disposed externally to the lens unit, thus resulting in a large lens unit.

To reduce the size of the lens unit, devices that use the deformation of a piezoelectric element to drive the lens have also been proposed. See, for example, Japanese Unexamined Patent Appl. Pub. H7-274546 (pages 3 to 4), Japanese Unexamined Patent Appl. Pub. H8-66068 (pages 3 to 4), and Japanese Unexamined Patent Appl. Pub. H4-69070 (pages 3 to 5). A piezoelectric-element-based drive apparatus as taught in H7-274546, H8-66068, and H4-69070 has a lens and a lens frame as the driven member, a drive shaft frictionally coupled to the lens frame, and a piezoelectric element to which this drive shaft is fixed. When a voltage with a specified waveform is applied to the piezoelectric element, it oscillates by expanding and contracting along the drive shaft. This linear oscillation is transferred to the drive shaft, and the driven member, which is friction-coupled to the draft shaft, is thus driven. The voltage applied to the piezoelectric element is more specifically a pulse wave that causes the piezoelectric element to displace gradually in the drive direction and then displace rapidly in the opposite direction. The driven member moves in the drive direction as a result of friction with the drive shaft, but because the inertia of the driven member exceeds the friction when the piezoelectric element moves in the opposite direction, the driven member does not move in the opposite direction and is thus driven in the specified drive direction.

A large electromagnetic motor disposed externally to the lens unit, as is required with the drive apparatus taught in H10-161001, is therefore not required with the drive apparatus taught in H7-274546, H8-66068, and H4-69070, and a complicated mechanism having gears and cam rings for transferring the drive power of the electromagnetic motor to the driven member is not needed. The drive apparatus taught in H7-274546, H8-66068, and H4-69070 therefore affords a smaller lens unit with a simple construction.

With the drive method taught in H7-274546, H8-66068, and H4-69070, the expansion and contraction of the piezoelectric element when a voltage is applied is transferred directly to the drive shaft, and the driven member is driven by a friction coupling between the drive shaft and the lens frame. To drive the driven member quickly with this arrangement, the drive shaft must move a long distance with each oscillation, or more specifically the expansion/contraction displacement of the piezoelectric element must be great. This increases the size of the device in the expansion/contraction direction of the piezoelectric element.

Furthermore, while the driven member is held in the drive direction by friction with the drive shaft, the driven member can move easily and is unstable if this friction is too weak. Conversely, if friction is too great, energy loss when the shaft is driven increases, and drive efficiency deteriorates.

SUMMARY OF THE INVENTION

With consideration for the foregoing problems, an object of the present invention is therefore to provide a drive apparatus that can sufficiently increase drive efficiency while reducing the size, and to provide a lens unit and camera using such a drive apparatus.

A drive apparatus according to the present invention comprises an oscillator that oscillates in response to deformation of a piezoelectric element, and a cam member that is directly contacted by the oscillator and moves, rotationally or linearly, in response to oscillation of the oscillator. The cam member has at least one drive guide member formed therein for engaging a driven member and causing the driven member to move reciprocally.

This drive guide member is a cam channel, for example. The oscillator is preferably a piezoelectric actuator having a substrate of stainless steel, for example, and flat piezoelectric elements disposed on the surfaces of the substrate.

The number of oscillators and associated cam members is not specifically limited; there can be one, two or more sets of such components. The number is determined according to the number of driven members, for example.

Thus comprised, the oscillator directly contacts the cam member and can thus cause the cam member to move. As a result, a complicated drive mechanism involving an electromagnetic motor and incumbent gears or cam wheels is not needed. The simplified drive apparatus of this invention can therefore be made smaller. Furthermore, by driving the driven member using the vibrations from an oscillator, which works by expanding and contracting, the oscillator can be disposed at a position removed from the direction in which the driven member moves reciprocally. The overall length of the drive apparatus can thus be shortened in the direction of driven member movement and can be made smaller when compared with conventional devices driven by a piezoelectric element.

Furthermore, because the oscillator directly contacts the cam member in a drive apparatus according to the present invention, energy loss due to friction is reduced compared with conventional drive devices using a friction coupling, and drive efficiency can thus be desirably increased.

Preferably, the oscillator of a drive apparatus according to the present invention contacts the outside surface of a rotary shaft of the cam member. Moreover, the oscillator can contact the rotary shaft of the cam member from any direction. The cam member and drive guide member can thus be designed more freely and manufactured more easily.

In a drive apparatus according to another aspect of the invention the cam member, which rotates in response to oscillation of the oscillator, has a rib formed in a radial arc with respect to axis of rotation of the cam member, and the oscillator contacts this rib. The surface of this rib is preferably finished smooth with no surface roughness to prevent wear. Less torque is required to rotationally drive the cam member with this arrangement, because the rib on the cam member is formed in an arc, and the point of contact with the oscillator is sufficiently separated from the axis of rotation of the cam member. Furthermore, because the surface of the arc of the rib is long in the circumferential direction, that is, in the direction in which the cam member moves rotationally, the rotational angle that the cam member moves due to a number of oscillator vibrations is small. The cam member can thus be moved in small steps, and the driven member linked to the cam member can be moved reciprocally in fine increments.

Preferably, there are at least two drive guide members, each formed as a spiral segment around the axis of rotation of the cam member. By thus forming the drive guide members about the axis of rotation, the drive guide members can be located efficiently in the cam member, thus helping to reduce the size of the cam member. This, in turn, helps to reduce the size of the drive apparatus.

Yet further preferably, the drive apparatus of the present invention also has a rotary shaft contacted by the oscillator. The cam member rotates in conjunction with rotation of this rotary shaft and can be assembled to and removed from the rotary shaft. As a result of this removable assembly, the reciprocal movement of the driven member by via the cam member can be verified, and driving the rotary shaft circularly via the oscillator can be separately and independently verified. The design characteristics of the cam member and driven member, and the oscillator and rotary shaft, can thus be separately optimized, thereby assuring good reciprocal operation of the driven member and good drive performance of the rotary shaft. As a result, the drive performance of the drive apparatus can be improved.

Yet further preferably, this drive apparatus also has a lever member fixed to, and projecting radially from, the rotary shaft. In addition, the axis of rotation of the rotary shaft and the axis of rotation of the cam member are the same, and the distal end portion of this lever member engages the cam member. By thus connecting the rotary shaft and cam member by way of an intervening lever member, the drive force of the rotary shaft can be transferred to a location separated a specific distance from the rotational axis of the cam member. The lever member can thus be disposed without interfering with the drive guide members. In addition, while the rotary shaft and cam member can be removably assembled together, the effect of play in the connection of the rotary shaft with the cam member on the rotational angle of the cam member is reduced because the circular movement is transferred by way of the intervening lever member, and the driven member can be driven forward and backward with greater precision.

Yet further preferably, the driven member is housed in a frame having a plurality of side surfaces, and the drive apparatus further comprises a plurality of cam members and a plurality of associated oscillators are disposed on the same side surface of the frame. With this arrangement, the drive apparatus can be rendered even smaller. Forming the drive guide members in a spiral shape is a particularly effective means of making the cam member smaller, and thus makes it easy to dispose a plurality of cam members and oscillators on the same side surface of the frame.

Further preferably, the plurality of cam members and oscillators are disposed symmetrically with respect to a point on the same side surface. By thus rendering the cam members and oscillators symmetrically with respect to a common point, the cam members and oscillators can be efficiently located on the same surface of the frame without interfering with each other, and space can be used more efficiently on that side of the frame.

According to another aspect, in which the cam member moves in a line in response to oscillation of the oscillator, the cam member has a relatively straight rib formed in a line following the direction of cam member movement. The oscillator directly contacts the rib of the cam member. With this arrangement, energy loss due to friction can be reduced compared with conventional drive devices using a friction coupling and drive efficiency can be desirably increased. Moreover, the need for complicated mechanism is eliminated, and the drive apparatus can thus be rendered smaller. Using a relatively straight rib results in the cam member being driven in a straight line. The drive mechanism is thus simpler and smaller than a mechanism that drives the cam member using a rotary shaft.

Yet further preferably, the oscillator has an oscillation mode that is a combination of reciprocal and bending oscillation and that causes a contact portion of the oscillator to trace an elliptical path. When the oscillations of the oscillator result in the contact portion tracing an elliptical path, friction varies between the oscillator and the drive shaft, drive member, and support member at the near and far sides of the oscillation path. More specifically, friction increases when the oscillator is positioned on the oscillation path near the drive shaft, drive member, or support member. The driven member is thus driven reliably according to the direction in which the oscillator is oscillating.

Yet further preferably, the oscillation direction of the elliptical oscillation mode can be changed freely. The direction in which the driven member is driven can be desirably controlled by changing the oscillation direction of the oscillator. Two or more oscillators are therefore not needed to drive the driven member in more than one direction; rather, a single oscillator can be used to reciprocally drive a driven member in both forward and backward directions.

Yet further preferably, a drive apparatus according to the present invention also comprises at least two guide shafts for guiding reciprocal movement of the driven member, and the driven member is positioned on the guide shaft closer to the cam member. By thus positioning the driven member on the guide shaft that is closest to the cam member, there is less play between the guide shaft and driven member when the cam member drives the driven member forward and backward and the driven member thus travels smoothly.

A drive apparatus according to another aspect of the invention comprises at least two guide shafts for guiding reciprocal movement of the driven member, and the cam member is disposed proximally to the guide shafts. By thus disposing the cam member proximally to the guide shafts, the distance from the cam member to the guide shafts is short and the torque load on the cam member is reduced when the cam member drives the driven member forward and backward.

A lens unit according to a further aspect of the present invention includes a drive apparatus as described above, and a frame to which the drive apparatus is installed. The driven member in this lens unit is a lens, preferably a zoom or focusing lens.

In another arrangement, the lens of the lens unit is mounted in the frame. The driven member driven by the drive apparatus is an imaging device for converting an image formed by the lens to an electrical signal.

The lens, whether a zoom or focusing lens, can be a single optical element, or an assembly of multiple optical elements.

The imaging device could be a pickup tube or a charge-coupled device (CCD), for example.

This aspect of the invention achieves the same benefits described above in a lens unit. More specifically, lens unit size can be reduced while improving drive efficiency, thereby achieving the object of the present invention.

A camera according to another aspect of the present invention comprises a lens driven by a drive apparatus as described above, a recording medium for recording an image formed by the lens, and a case in which the drive apparatus, lens, and recording medium are housed.

This aspect of the invention achieves the same benefits described above in a camera. More specifically, camera size can be reduced while improving drive efficiency, thereby achieving the object of the present invention.

The present invention can thus sufficiently increase drive efficiency while reducing the size. Other objects and attainments together with a fuller understanding of the invention will become apparent and appreciated by referring to the following description and claims taken in conjunction with the accompanying drawings.

DESCRIPTION OF THE PREFERRED EMBODIMENTS

Figure 1:
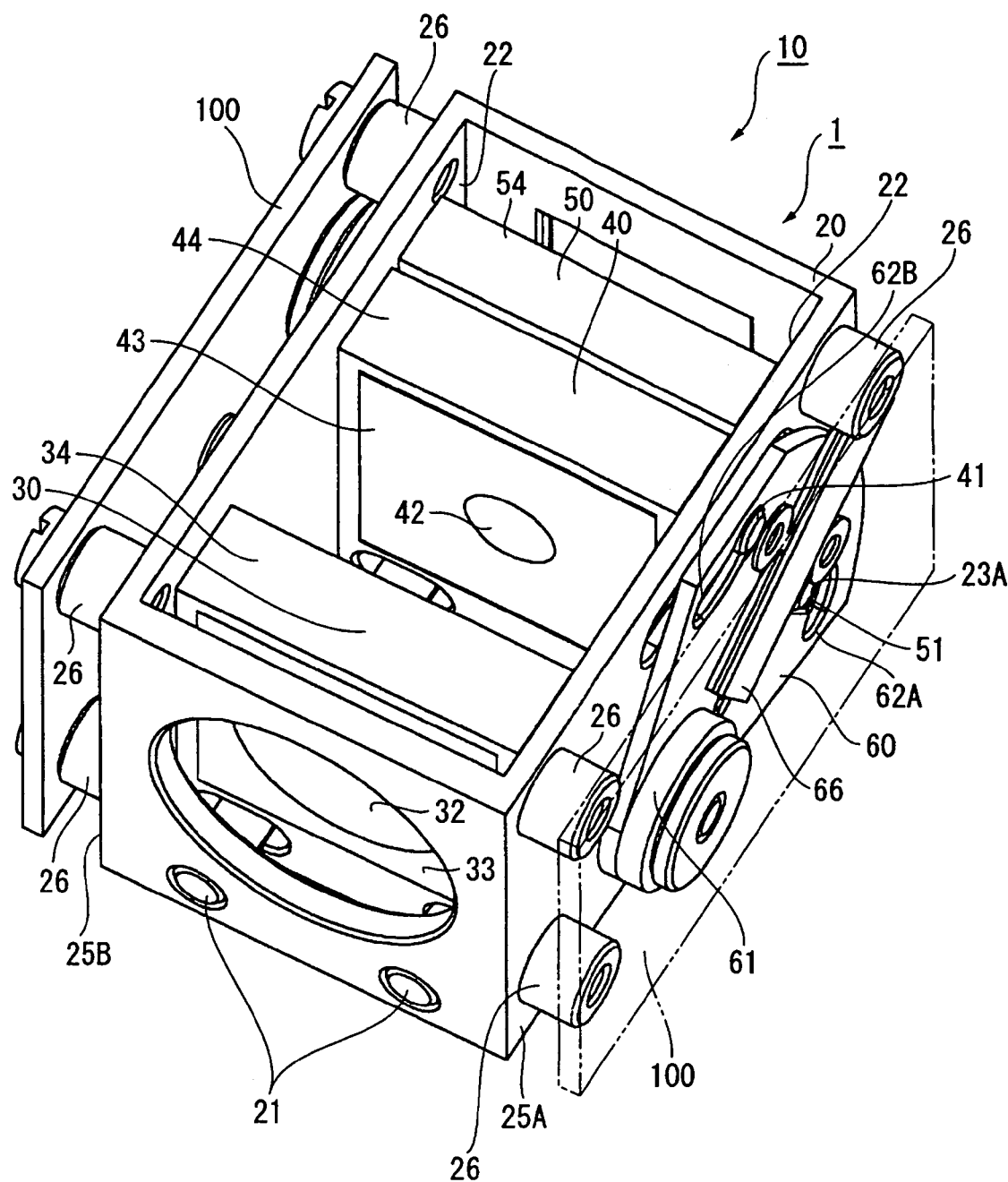
FIG. 1 is an oblique view of a lens unit according to a first embodiment of the present invention.

Preferred embodiments of the present invention are described below with reference to the accompanying figures. It should be noted that like parts or parts with identical function are identified by like reference numerals; accordingly, further description thereof is simplified or omitted in the second and subsequent embodiments.

Embodiment 1

A lens unit 10 according to a first embodiment of the present invention is described below. This lens unit 10 is preferably manufactured and used integrally with the camera.

In addition to a lens unit 10, this camera has a recording medium for recording an image formed by lenses 30, 40, 50 of the lens unit 10, a drive apparatus 1 for driving the lenses 30, 40, 50, and a case in which these parts are housed. The camera, recording medium, and case are not shown in the figures.

Figure 2:
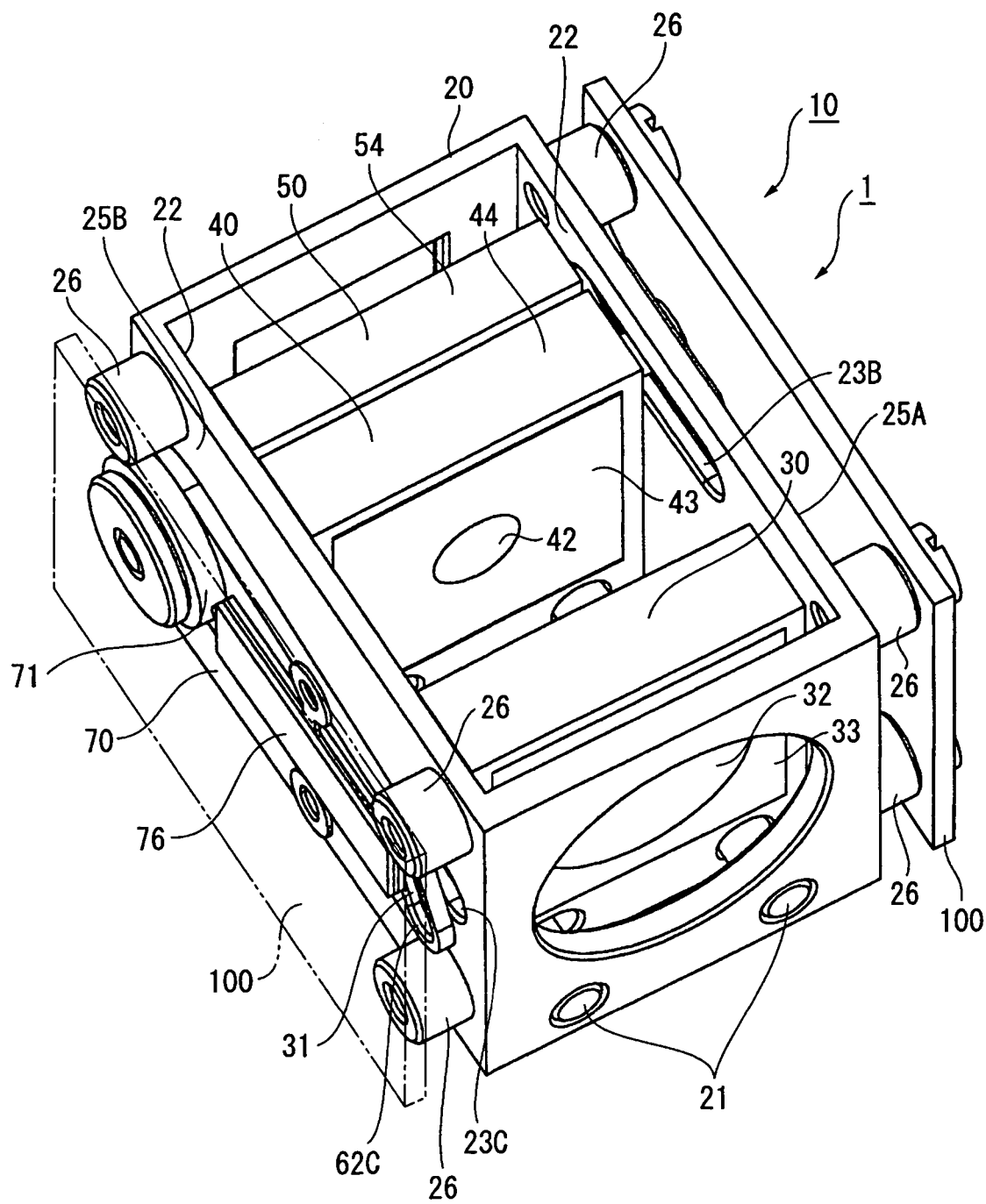
FIG. 2 is an oblique view from a different direction of the lens unit shown in FIG. 1.

FIG. 1 is an oblique view from the top right side of the lens unit 10. FIG. 2 is an oblique view from the top left side of the lens unit 10. FIGS. 3A and 3B show the operation of cam member 60, while FIGS. 4A and 4B show the operation of cam member 70. FIG. 5 is an enlarged view of the oscillator 66 for driving the cam member 60.

As shown in FIG. 1 to FIG. 5, the lens unit 10 includes a rectangular tube-shaped frame 20, a first lens 30, a second lens 40, and a third lens 50, which function as the driven members in this embodiment, a cam member 60 for driving the second lens 40 and third lens 50 forward and backward, a cam member 70 for driving the first lens 30 forward and backward, an oscillator 66 for driving cam member 60 rotationally, and an oscillator 76 for driving cam member 70 forward and backward.

Drive apparatus 1 drives the lenses 30, 40, 50 by means of cam members 60 and 70 and respective oscillators 66 and 76. These components are described more fully below.

The frame 20 has two parallel, rod-shaped guide shafts 21 connected between the front and back ends. These shafts 21 guide the forward and backward travel of the lenses 30, 40, 50 and extend through the entire range of lens travel in the optical axis direction. The guide shafts 21 also work to prevent the lenses 30, 40, 50 from tilting forward or backward.

Oval-shaped channels 23A and 23B are formed in one side wall 22 of the frame 20, and oval-shaped channel 23C is formed in the opposite side wall 22. These channels 23A, 23B, 23C are sized so that the cam pins 31, 41, 51 of lenses 30, 40, 50 can move with sufficient freedom therein.

The first lens 30 is disposed inside the frame 20, and has a cam pin 31 disposed inside channel 23C of frame 20. The second lens 40 is disposed inside the frame 20, and has a cam pin 41 disposed inside channel 23B of frame 20. The third lens 50 is disposed inside the frame 20, and has a cam pin 51 disposed inside channel 23A of frame 20.

Figure 8:
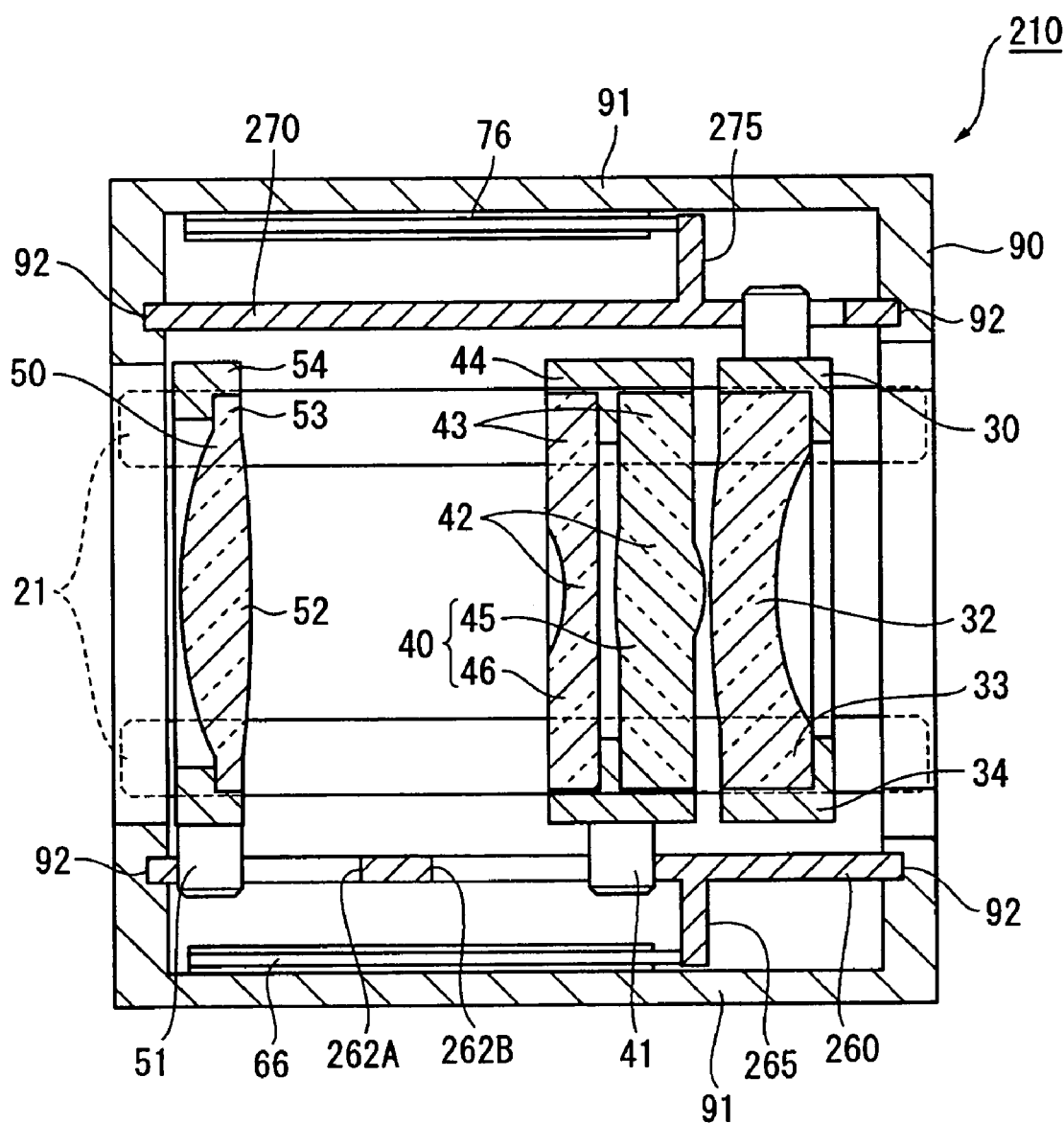
FIG. 8 is a sectional view of a lens unit according to a third embodiment of the invention.

The first, second and third lenses 30, 40, 50 each have a center light-gathering portion 32, 42, 52 (light-gathering portion 52 is shown in FIG. 8) and a surrounding mounting frame portion 33, 43, 53 (mounting frame portion 53 is shown in FIG. 8) integrally molded from a lens material, and a support frame 34, 44, 54 for holding the center light-gathering portion and mounting frame portion. The cam pins 31, 41, 51 are disposed to the support frames 34, 44, 54.

In the first embodiment, the first lens 30 is the focusing lens, and the second and third lenses 40, 50 are zoom lenses. However, the third lens 50 is not limited to zooming. Lens 50 can be a focusing lens, in which case the lens unit 10 could be used as a focusing lens unit by appropriately controlling the design and optical characteristics of each lens 30, 40, 50. The second lens 40 combines a concave lens 46 and a convex lens 45 as shown in FIG. 8 in this embodiment. In general, the design of each lens 30, 40, 50 is determined appropriately according to the purpose of each lens.

The light-gathering portions 32, 42, 52 and mounting frame portions 33, 43, 53 of the lenses 30, 40, 50 are integrally molded from a lens material in this embodiment, but molding only the light-gathering portions 32, 42, 52 from a lens material and molding the mounting frame portions 33, 43, 53 from a different material integrally with the support frames 34, 44, 54 is also possible. Yet further, the light-gathering portions 32, 42, 52, mounting frame portions 33, 43, 53, and support frames 34, 44, 54 can all be integrally molded from a lens material.

Cam member 60 is disposed between the outside surface 25A of one side of the frame 20 and a corresponding cover member 100. Cam member 70 is likewise disposed relative to outside surface 25B of the opposite side of the frame 20 and corresponding cover member 100. Each cam member 60, 70 is offset from the respective outside surface 25A, 25B by three legs 26.

Cam member 60 is substantially fan-shaped and has a rotary shaft 61 that supports the cam member 60 on outside surface 25A so that the cam member 60 can rotate freely on the rotary shaft 61. Two cam channels 62A and 62B are formed in the flat surface of the cam member 60 as drive guide members. The cam channels 62A and 62B are arc-shaped. The cam pin 41 of the second lens 40 engages cam channel 62B, and the cam pin 51 of the third lens 50 engages cam channel 62A. As a result, when the cam member 60 turns, cam pins 31 and 41 are guided by the cam channels 62A and 62B and move at a speed and through a range of motion determined by the shape of those cam channels, thus causing the second lens 40 and third lens 50 to move forward and backward.

Cam member 70 is substantially L-shaped and has a rotary shaft 71. This cam member 70 is rotationally supported around the rotary shaft 71 on outside surface 25B of the frame 20. A single cam channel 62C is formed as a drive guide member in the flat surface of the cam member 70. The cam pin 31 of the first lens 30 engages the cam channel 62C so that when the cam member 70 turns, the cam pin 31 is guided by the cam channel 62C and moves at a speed and through a range determined by the shape of that cam channel, thus causing the first lens 30 to move forward and backward.

Oscillators 66 and 76 contact the outside surface of the rotary shafts 61, 71 of the cam members 60 and 70, and oscillate in a plane substantially perpendicular to the rotary shafts 61, 71. The direction from which the oscillators 66 and 76 contact the rotary shafts 61, 71 is not specifically limited; the oscillators 66 and 76 can contact the rotary shafts 61, 71 from any direction causing the rotary shafts 61, 71 to rotate.

An opening could also be formed in the flat surface of the cam members 60 and 70, and the oscillators 66 and 76 could be disposed inside the openings to contact the outside surface of the rotary shafts 61, 71. The size of the openings is large enough that there will be no contact with the oscillators 66 and 76 when the cam members 60 and 70 rotate. The oscillators 66 and 76 could be supported on respective outside surfaces 25A and 25B of the frame 20 or on the cover members 100.

To prevent wear with the contact portion of the oscillators 66 and 76, the outside surfaces of the rotary shafts 61, 71 are finished smooth with no roughness. The outside diameter of the contact portion of the oscillators 66 and 76 is as large as possible as this reduces the angle of rotation relative to a specific number of oscillations, and thus enables driving the lenses 30, 40, 50 with precision. The outside shape of the rotary shafts 61, 71 is a circular arc in the section where the shafts contact the oscillators, but is not limited to that shape in the section that does not contact the oscillators 66 and 76.

As shown in FIG. 5, the oscillator 66 has a flat, substantially rectangular reinforcing substrate 81 and flat piezoelectric elements 82 disposed on both sides of the reinforcing substrate 81. The reinforcing substrate 81 has a protruding contact tip 81A formed at one longitudinal end. The outside end of this contact tip 81A contacts the circumferential surface of the rotary shaft 61.

Arm members 81B are formed integrally with the reinforcing substrate 81 and project away from the sides in substantially the middle of the long sides of the substrate 81 and in a substantially perpendicular direction to substrate 81. The ends of the arm members 81B are fixed to the cover member 100 by intervening means that press the contact tip 81A to the rotary shaft 61 with a specific elastic force. The reinforcing substrate 81 is made from stainless steel or other material.

The piezoelectric elements 82 bonded to the rectangular portion on each flat side of the reinforcing substrate 81 are made from an appropriately selected piezoelectric material such as lead zirconate titanate (PZT), quartz, lithium niobate, barium titanate, lead titanate, lead metaniobate, polyvinylidene fluoride, lead zinc niobate, or lead scandium niobate.

Both sides of the piezoelectric elements 82 are plated with nickel or lead to form electrodes. Two longitudinal channels 83A and two transverse channels 83B substantially perpendicular to channels 83A are formed in the piezoelectric elements 82. The longitudinal channels 83A divide the piezoelectric elements 82 into three electrode parts of equal width, and the transverse channels 83B divide the outside electrode parts into two electrode parts each of substantially equal length.

The divisions created by channels 83A, 83B thus form five electrodes 82A, 82B, 82C, 82D, and 82E on the surface of the piezoelectric element 82. Of these electrodes, a lead wire connecting the diagonally opposite electrodes 82A and 82E, a lead connecting electrodes 82B and 82D, and a lead connected to electrode 82C are connected to a voltage supply.

Electrodes 82A to 82E are formed on the piezoelectric elements 82 on both sides of the reinforcing substrate 81 in an opposing relationship. Note that the leads, screws, and voltage supply are not shown in FIG. 5. The other oscillator 76 is formed in the same manner as oscillator 66, and can thus be understood from the foregoing description of the oscillator 66; further description of oscillator 76 is thus omitted.

By selecting specific electrodes 82A to 82E and applying a voltage thereto, the oscillator can be driven in a longitudinal oscillation mode in which it vibrates reciprocally in the longitudinal direction, and in a bending oscillation mode in which it vibrates widthwise with respect to the reinforcing substrate 81. As a result of these vibrations, the contact tip 81A oscillates in an elliptical path produced by combining both longitudinal and bending oscillation modes.

The rotary shaft 61 can also be driven to rotate in a forward or reverse direction by appropriately changing the electrodes of the piezoelectric elements 82 to which voltage is applied when driving the oscillator 66.

For example, if the direction of rotation is forward when electrodes 82A, 82C, 82E are energized and voltage is applied between these electrodes and ground (the reinforcing substrate 81 in this example), the direction of the rotary shaft 61 can be reversed by energizing electrodes 82B, 82C, 82D and applying voltage between these electrodes and ground.

The frequency of the AC voltage applied to the piezoelectric elements 82 is set so that a bending oscillation resonance point appears near the longitudinal resonance point when the reinforcing substrate 81 oscillates and the contact tip 81A travels in a desirable elliptical path. The dimensions, thickness, material, length-to-width ratio, electrode division, and other design characteristics of the piezoelectric elements 82 are likewise appropriately determined so that the contact tip 81A travels a desirable elliptical path when voltage is applied to the piezoelectric elements 82.

The waveform of the AC voltage applied to the oscillator 66 can take any of a variety of forms; a sine wave, square wave, or trapezoidal wave could be used, for example.

Operation of the lens unit 10 is described next with reference to FIG. 3.

When the oscillator 66 vibrates while in contact with the outside surface of rotary shaft 61, the shaft 61 rotates a specific angle, causing the cam member 60, which is fixed to the rotary shaft 61, to rotate a specific angle. As a result, the cam channels 62A and 62B formed in the cam member 60 rotate, and the outside surfaces of the cam pins 51 and 41 engaged in the cam channels 62A and 62B are guided by the inside surfaces of the cam channels 62A and 62B as the pins move inside the channels 23A and 23B.

For example, when the rotary shaft 61 turns counterclockwise (in the direction of arrow R1) from the position shown in FIG. 3A, the second lens 40 and third lens 50 to which cam pins 41 and 51 are disposed move in mutually separate directions, and the gap between the second lens 40 and third lens 50 thus increases as shown in FIG. 3B.

When the drive voltage is then applied to different electrodes 82A to 82E, thus causing the rotary shaft 61 to rotate clockwise in the direction of arrow R2 from the position shown in FIG. 3B, the second lens 40 and third lens 50 move closer together again and thus return to the position shown in FIG. 3A.

As a result of this action, the second and third lens 40, 50 function as a zoom lens.

Figure 4:
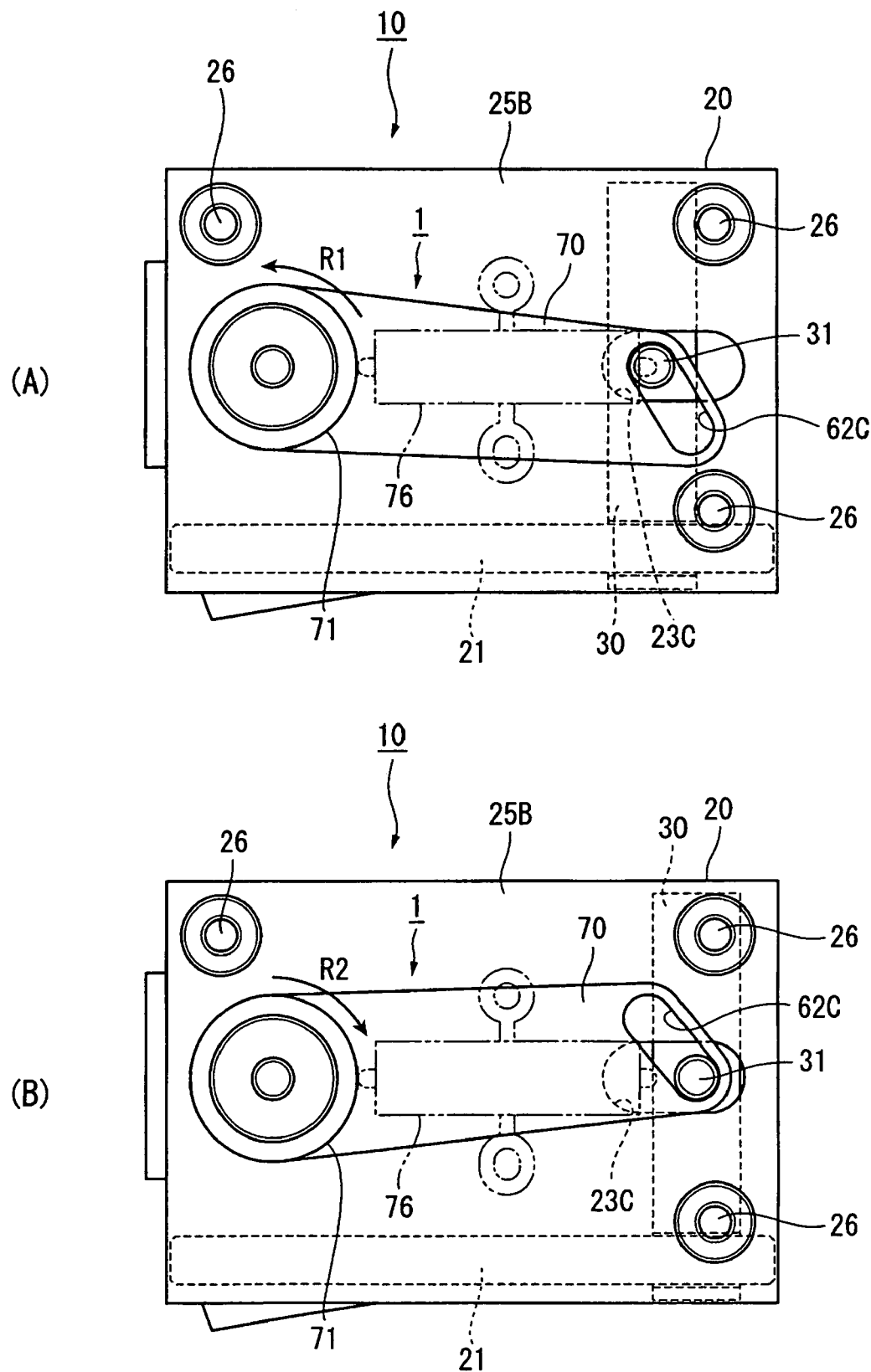
FIGS. 4(A) and 4(B) show operational details of another cam member in the first embodiment of the present invention.
Figure 5:
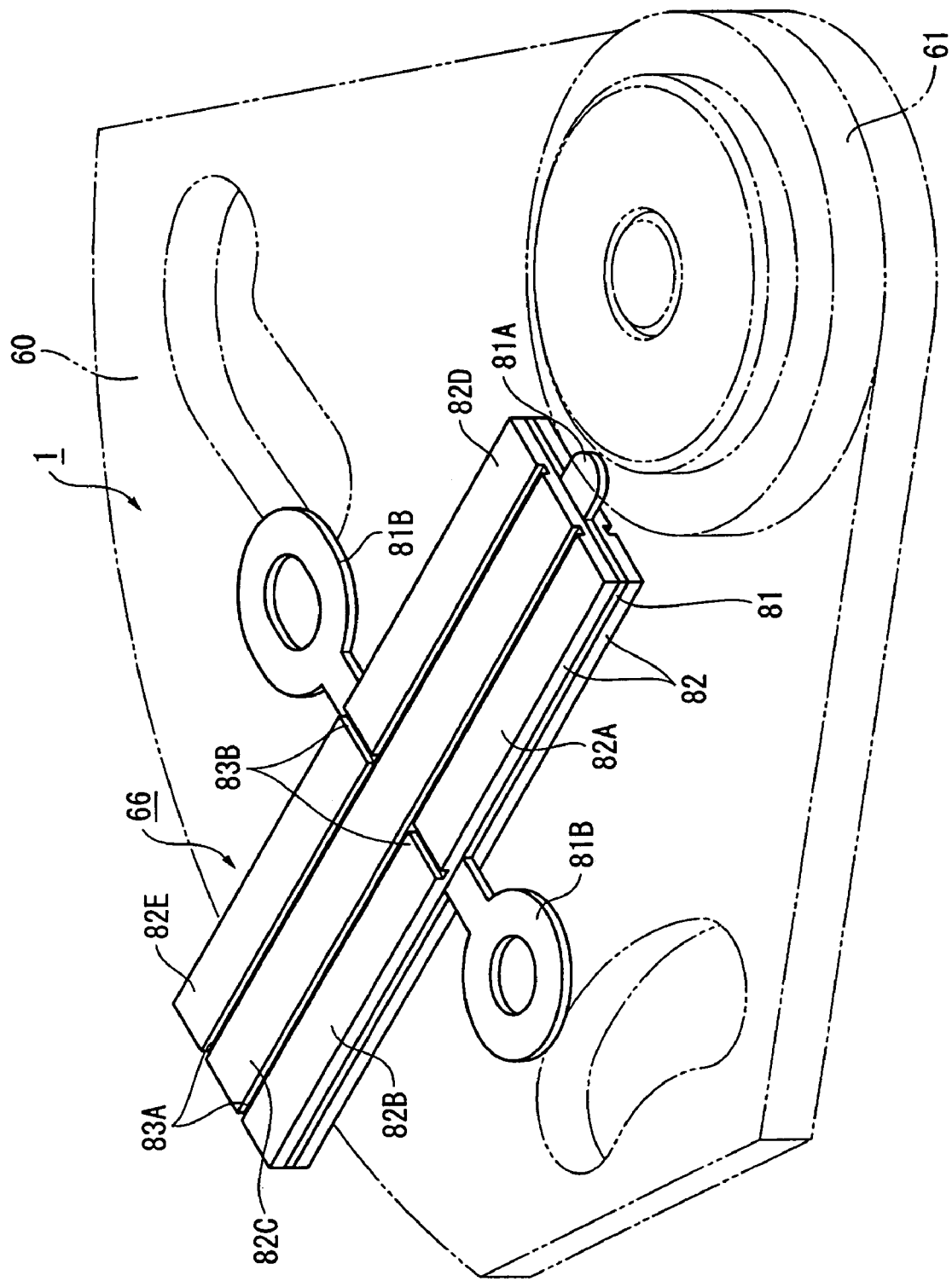
FIG. 5 is an enlarged view of the oscillator for driving the cam members.

When the oscillator 76 vibrates in contact with the outside surface of the rotary shaft 71, the rotary shaft 71 likewise rotates a specific angle as shown in FIG. 4. This rotation causes the cam member 70 to move a specific angle in unison with the rotary shaft 71. As a result, the cam channel 62C formed in the cam member 70 also rotates, and the outside surface of the cam pin 31 engaged in cam channel 62C is guided by the inside surface of the cam channel 62C as the pin moves inside the channel 23C.

If the rotary shaft 71 turns counterclockwise in the direction of arrow R1 from the position shown in FIG. 4A, for example, the first lens 30 linked to the cam pin 31 moves from an inside position toward the outside of the frame 20, and is thus pushed toward the end of the frame 20 as shown in FIG. 4B.

When the rotary shaft 71 is then rotated clockwise in the direction of arrow R2 from the position shown in FIG. 4B, the first lens 30 moves back toward the middle of the frame 20 and returns to the position shown in FIG. 4A.

As a result of this action, the first lens 30 functions as a focusing lens.

Figure 3:
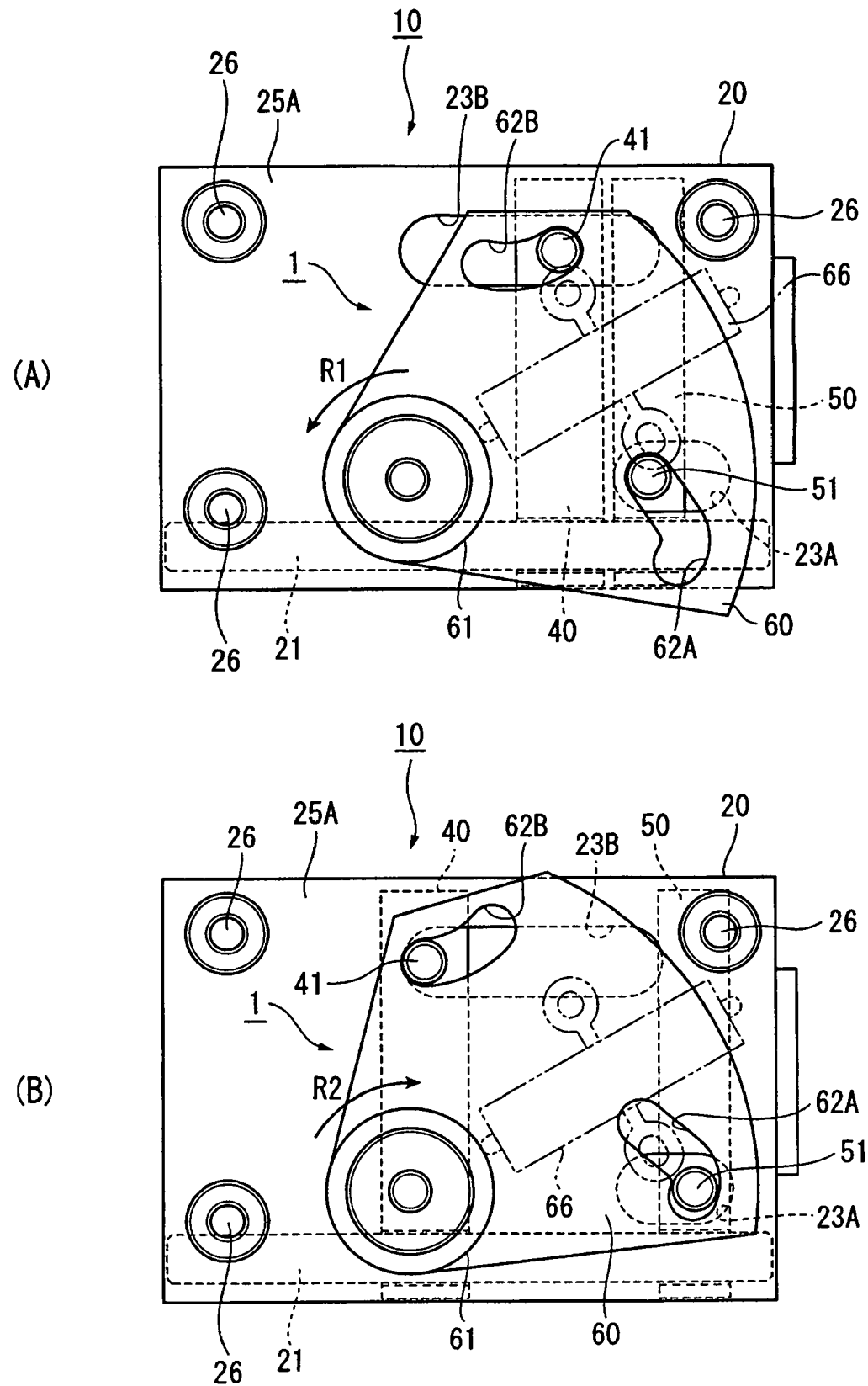
FIGS. 3(A) and 3(B) show operational details of one cam member in the first embodiment of the present invention.

By thus changing the electrodes 82A to 82E of the piezoelectric elements 82 to which voltage is applied while applying the oscillation directly to the rotary shafts 61, 71 of the cam members 60 and 70, the first lens 30, second lens 40, and third lens 50 can be driven forward and back as shown in FIG. 3 and FIG. 4.

The lenses 30, 40, 50 can also be stopped and held in any desired position by detecting the positions of the lenses 30, 40, 50 using sensors not shown and feeding this information back to a control circuit to control operation.

This embodiment of the present invention thus provides the following benefits.

(1) A drive apparatus 1 used in the foregoing lens unit 10 causes rotary shafts 61, 71 to rotate in response to the vibration of oscillators 66 and 76, thus causing the cam channels 62A, 62B, 62C of the cam members 60 and 70 to rotate. As a result, cam pins 31, 41, 51 are guided by the shape of the cam channels 62A, 62B, 62C, and the lenses 30, 40, 50 are thus driven forward and backward.

A complicated drive mechanism involving an electromagnetic motor and requisite gears or cam rings such as used in the prior art is therefore not needed; the construction can therefore be simplified, and a smaller lens unit 10 can be provided.

Furthermore, compared with driving a driven member by means of the expansion/contraction deformation of a conventional piezoelectric element, driving the lenses 30, 40, 50 by means of oscillators 66 and 76 enables reducing the size of the oscillators 66 and 76, thus contributing to a smaller lens unit 10.

Moreover, disposing the oscillators 66 and 76 and cam members 60 and 70 on the sides of the lens unit 10 enables shortening the overall length of the drive apparatus 1 compared with a conventional arrangement in which the oscillator is disposed in the lengthwise direction of the frame 20. In addition, assembling the oscillators 66 and 76 integrally with the cam members 60 and 70 allows their thickness to be reduced, thereby further reducing device size.

(2) Because the lenses 30, 40, 50 are driven forward and backward by means of cam pins 31, 41, 51 traveling along cam channels 62A, 62B, 62C, energy loss from friction can be reduced and drive efficiency can be sufficiently improved compared with conventional drive methods using a friction coupling.

Furthermore, because the cam pins 31, 41, 51 of the lenses 30, 40, 50 engage cam members 60 and 70, the lenses 30, 40, 50 cannot move easily when driving stops, and the lens can be held in a stable position. The positions of the lenses 30, 40, 50 also do not change when voltage is not applied to the piezoelectric elements 82 of the oscillators 66 and 76. Power consumption can thus be reduced because continuously applying a voltage to the piezoelectric elements 82 is unnecessary.

(3) As a result of the oscillators 66 and 76 oscillating in an elliptical path, the drive force increases when the path of the contact tips 81A of the oscillators 66 and 76 is nearest the rotary shafts 61, 71. The rotary shafts 61, 71 and cam members 60 and 70 are thus rotationally driven in the oscillation direction at that time, and the lenses 30, 40, 50 are reliably driven in a specific direction.

Because the attitude of the lenses 30, 40, 50 is maintained by the guide shafts 21 during this action, the lenses can be driven with high precision without the lenses tilting in the lengthwise direction of the frame 20.

(4) Because the second lens 40 and third lens 50 are simultaneously driven forward and backward by a single cam member 60, separate oscillators for independently driving the second lens 40 and third lens 50 are not needed. The parts count can therefore be reduced, and the size of the drive apparatus 1 can be reduced.

Embodiment 2

Figure 6:
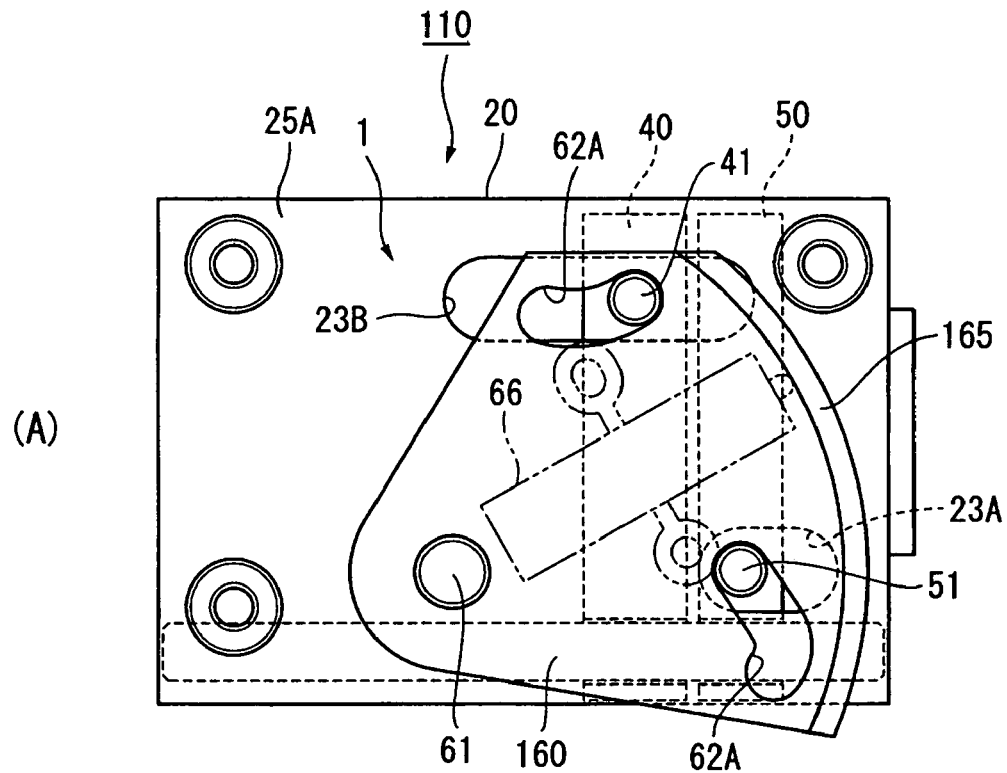
FIGS. 6(A) and 6(B) show operational details of one cam member in a second embodiment of the present invention.
Figure 6:
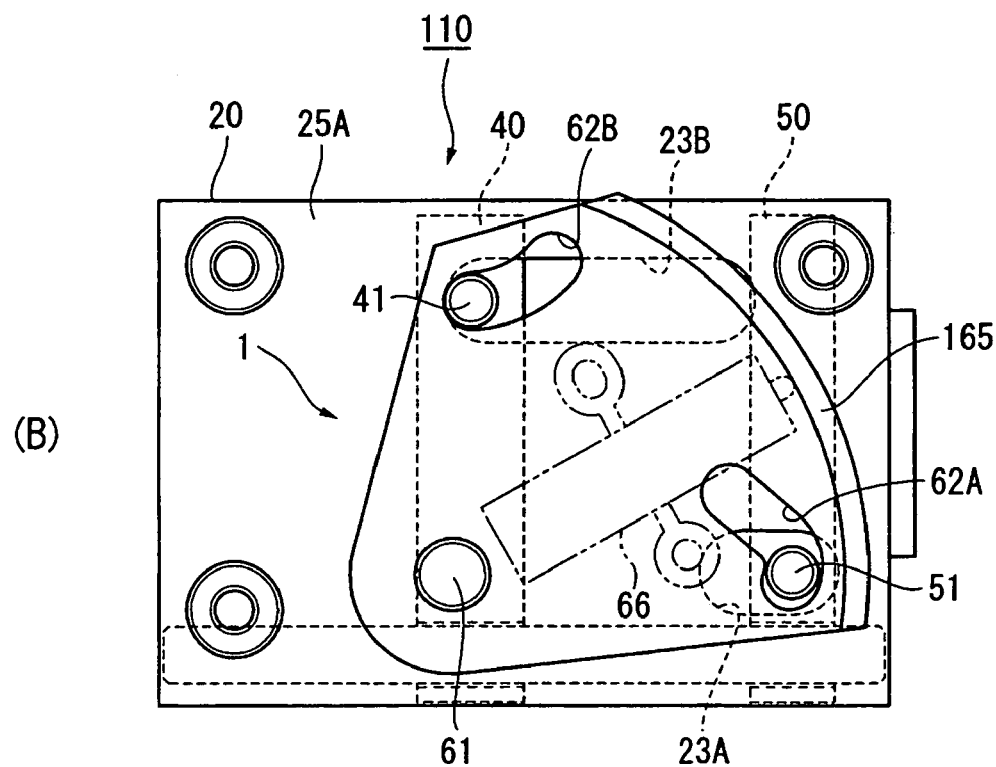

A lens unit 110 according to a second embodiment of the present invention is described next with reference to FIGS. 6 and 7.

This lens unit 110 differs from the lens unit 10 of the first embodiment in the shape of the cam members 160 and 170 of the drive apparatus 1, and the contact point of the oscillators 66 and 76.

As shown in FIG. 6A and FIG. 6B, cam member 160 is supported on the outside surface 25A of the frame 20. This cam member 160 is fan-shaped and pivots on a rotary shaft 61 disposed at one end. An arc-shaped rib 165 is formed in the direction of rotation of cam member 160 along the edge at the end opposite the rotary shaft 61.

Cam member 170 is likewise supported on the outside surface 25B of the frame 20. This cam member 170 is also fan-shaped and pivots on a rotary shaft 71 disposed at one end. An arc-shaped rib 175 is formed in the direction of rotation of cam member 170 along the edge at the end opposite the rotary shaft 71.

The vibration of oscillators 66 and 76 is transferred continuously directly to the ribs 165 and 175 of the cam members 160 and 170, thereby continuously driving the cam members 160 and 170. Furthermore, because the ribs 165 and 175 are separated from the rotary shafts 61, 71, the arc-shaped surface of the ribs 165 and 175 is long in the circumferential direction and the angle of rotation relative to the vibration of the oscillators 66 and 76 is small. As a result, the cam members 160 and 170 can be driven to move circularly in small increments, and less torque is required to rotationally drive the cam members.

The surfaces of the ribs 165 and 175 are finished smooth to remove surface roughness and prevent wear on the contact portion of the oscillators 66 and 76. The oscillators 66 and 76 are as described in the first embodiment.

Operation of this lens unit 110 is described next with reference to FIG. 6.

Vibration of the oscillator 66 in contact with the inside surface of the rib 165 of cam member 160 causes the cam member 160 to move circularly a specific angle on rotary shaft 61. As a result of this circular motion, the outside surfaces of the cam pins 41 and 51 engaged with the cam member 160 are guided by the inside surfaces of the cam channels 62A and 62B as the pins move inside the channels 23A and 23B.

For example, when the rib 165 is driven counterclockwise from the position shown in FIG. 6A, the second lens 40 and third lens 50 to which cam pins 41 and 51 are disposed move in mutually separate directions, and the gap between the second lens 40 and third lens 50 thus increases as shown in FIG. 6B.

Conversely, when the drive voltage is then applied to different electrodes 82A to 82E, thus causing the rib 165 to move clockwise from the position shown in FIG. 6B, the second lens 40 and third lens 50 move closer together again and thus return to the position shown in FIG. 6A.

As a result of this action, the second and third lenses 40, 50 function as a zoom lens.

Figure 7:
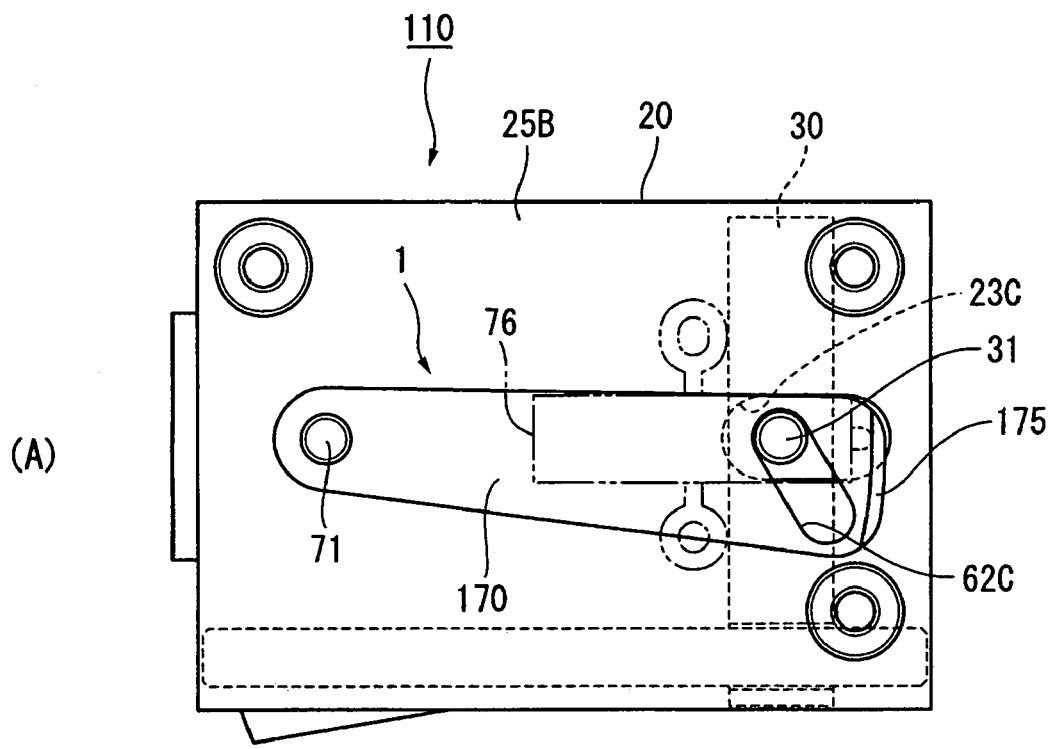
FIGS. 7(A) and 7(B) show operational details of another cam member in the second embodiment of the present invention.
Figure 7:
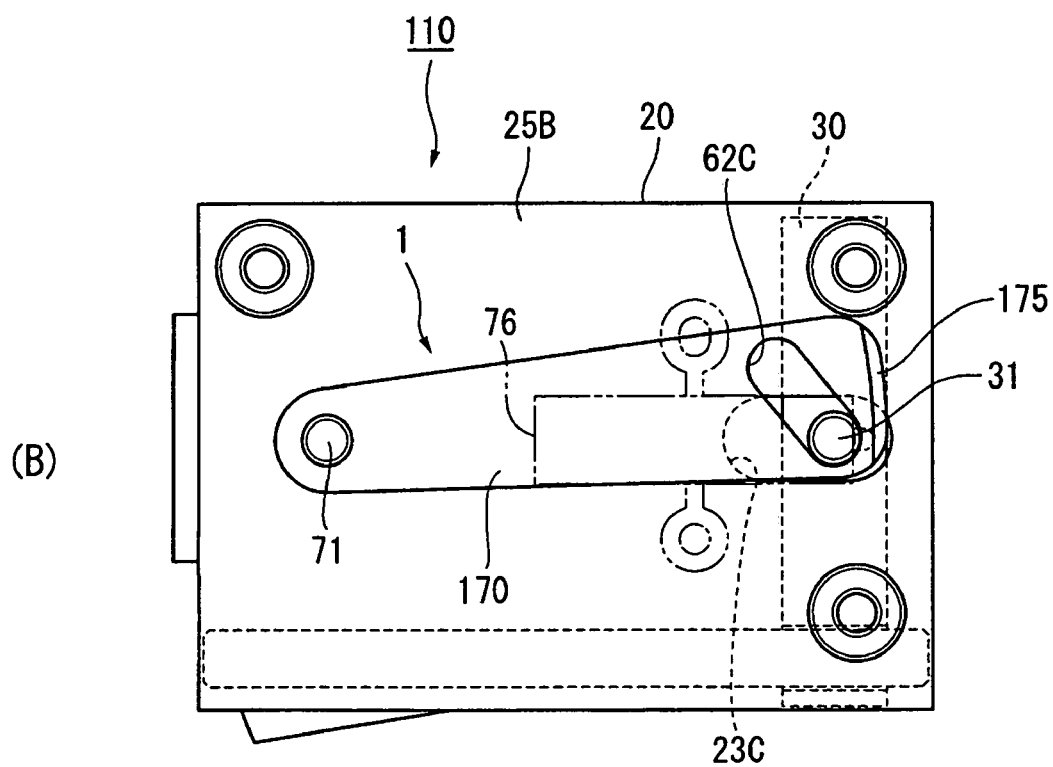

When the oscillator 76 vibrates in contact with the rib 175 formed in an arc along the direction of rotation, the cam member 170 likewise pivots a specific angle around the rotary shaft 71 as shown in FIG. 7. This rotation causes the cam member 170 to move a specific angle in unison with the rotary shaft 71. As a result, the cam channel 62C formed in the cam member 170 also rotates, and the outside surface of the cam pin 31 engaged in cam channel 62C is guided by the inside surface of the cam channel 62C as the pin moves inside the channel 23C.

If the rib 175 is driven counterclockwise from the position shown in FIG. 7A, for example, the first lens 30 linked to the cam pin 31 moves from an inside position toward the outside of the frame 20, and is thus pushed toward the end of the frame 20 as shown in FIG. 7B.

When the rib 175 is then rotated clockwise from the position shown in FIG. 7B, the first lens 30 moves back toward the middle of the frame 20 and returns to the position shown in FIG. 7A. As a result of this action, the first lens 30 functions as a focusing lens.

In addition to the benefits (1) to (4) of the first embodiment described above, this embodiment of the invention also has the following effect.

(5) Because the ribs 165 and 175 are separated from the axis of rotation of the rotary shafts 61, 71, the circumferential length of the arc-shaped surface of the ribs 165 and 175 is long. The angle of rotation relative to the vibration of the oscillators 66 and 76 in contact with the ribs 165 and 175 is thus reduced, and the lenses 30, 40, 50 linked to the cam members 160 and 170 can thus be moved forward and back in small increments. Less torque is also required to drive the cam members rotationally.

Embodiment 3

A lens unit 210 according to a third embodiment of the present invention is described next with reference to FIGS. 8–10.

The lens unit 210 according to this embodiment of the invention differs from the foregoing embodiments in the shape of the frame 90, the shape of the cam members 260 and 270, and the shapes of the ribs 265 and 275 of the cam members 260 and 270. These differences are described in detail below.

FIG. 8 is a section view of a lens unit 210 according to this embodiment of the invention. FIG. 9A and FIG. 9B describe the operation of the cam member 260. FIG. 10A and FIG. 10B describe the operation of the other cam member 270.

Figure 9:
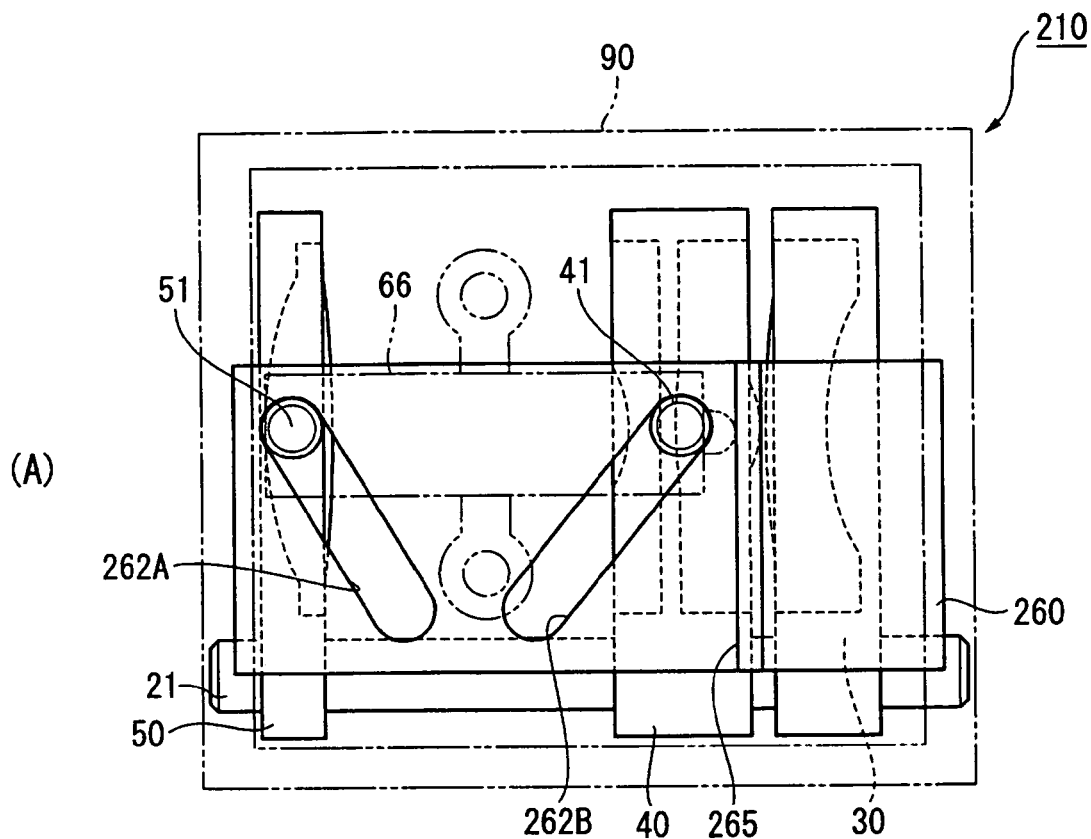
FIGS. 9(A) and 9(B) show operational details of one cam member in a third embodiment of the present invention.
Figure 9:
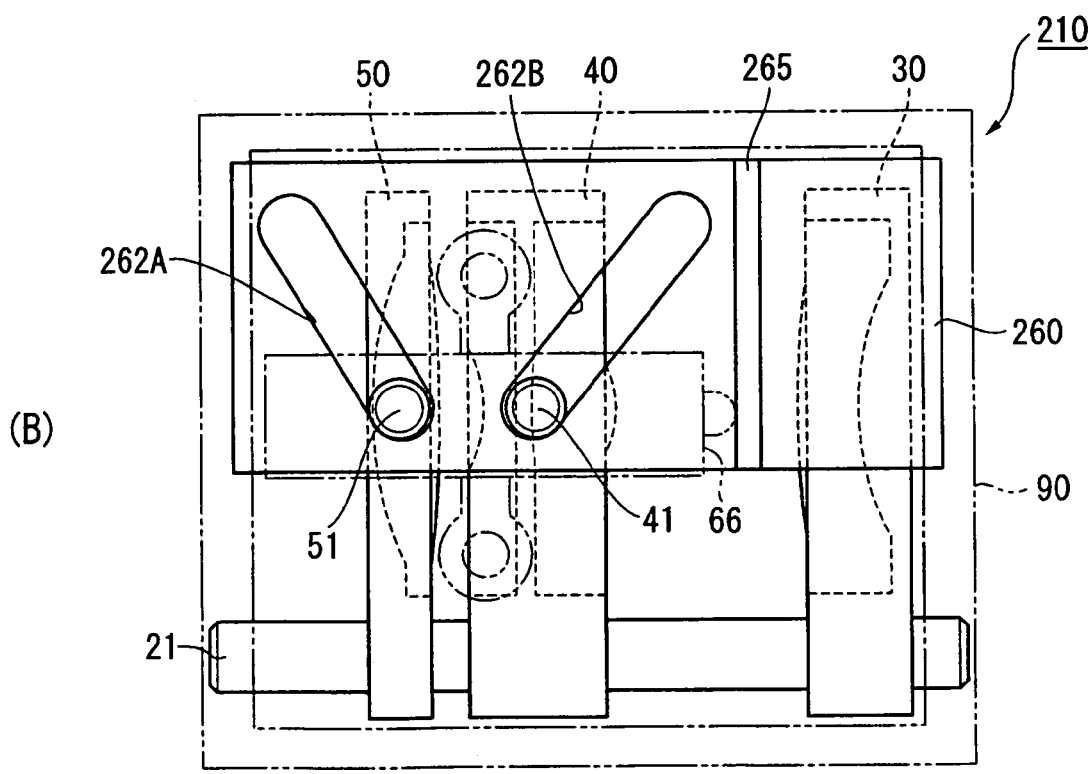
Figure 10:
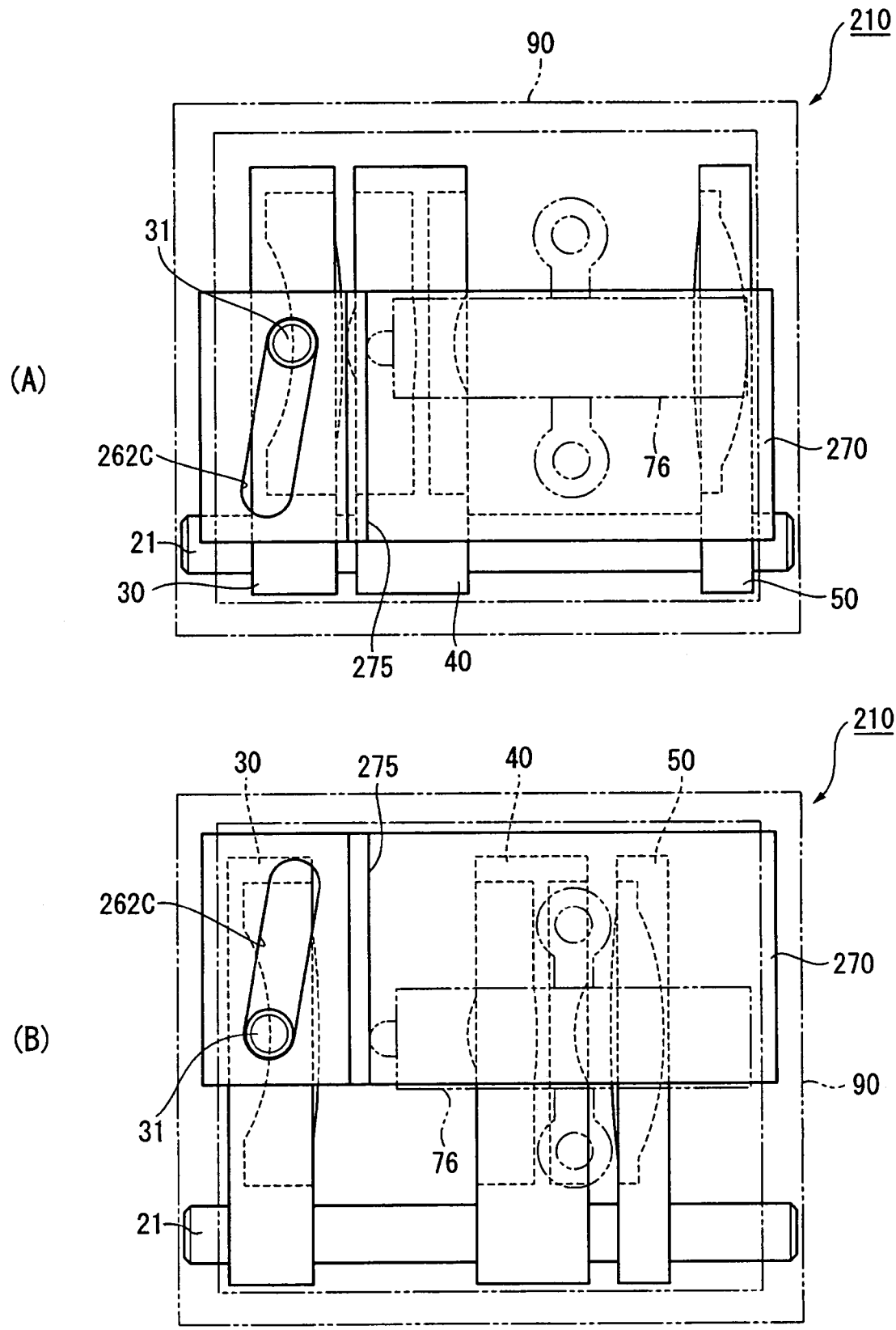
FIGS. 10(A) and 10(B) show operational details of the other cam member in a third embodiment of the present invention.

As shown in FIGS. 8–10, the cam member 270 driven by oscillator 76 is disposed on one side of the frame 90, and the cam member 260 driven by oscillator 66 is disposed on the other side of the frame 90. The oscillators 66 and 76 are fixed to the walls 91 of the frame 90.

The cam members 260 and 270 are rectangular-shaped with the longitudinal ends thereof fit into channels 92 formed in the frame 90 so that the cam members 260 and 270 can slide up and down. A rib 265 and cam channels 262A and 262B are formed on the side of cam member 260, and rib 275 and cam channel 262C are formed on the side of cam member 270. The ribs 265 and 275 are formed in a straight line in the same direction in which the cam members slide. The oscillators 66 and 76 contact the surfaces of the ribs 265 and 275.

Operation of this lens unit 210 is described next with reference to FIG. 9.

When oscillator 66 vibrates in contact with the rib 265 of the cam member 260, the cam member 260 slides up and down guided by the channels 92 in the frame 90. As a result, the outside surfaces of the cam pins 41 and 51 fit in cam member 260 are guided by the inside surface of the cam channels 262A and 262B as the pins travel inside the channels.

When the cam member 260 moves upward from the position shown in FIG. 9A, for example, the second lens 40 and third lens 50 having cam pins 41 and 51 move closer together such that the gap between the second lens 40 and third lens 50 decreases as shown in FIG. 9B.

Conversely, when the drive voltage is then applied to different electrodes 82A to 82E, thus causing the cam member 260 to move down from the position shown in FIG. 9B, the second lens 40 and third lens 50 move away from each other and return to the position shown in FIG. 9A.

As a result of this action, the second and third lenses 40, 50 function as a zoom lens.

When the cam member 270 is slid up as shown in FIG. 10, the first lens 30 having cam pin 31 moves from an inside position toward the outside of the frame 90 as shown in FIG. 10B.

Conversely, when the cam member 270 is driven to slide down from the position shown in FIG. 10B, the first lens 30 moves to an inside position in the frame 90 and returns to the position shown in FIG. 10A. As a result of this action, the first lens 30 functions as a focusing lens.

While this embodiment of the invention thus differs from the foregoing embodiments in that the cam members 260 and 270 slide in a straight line rather than rotating, other aspects of this embodiment are the same as in the first embodiment and the benefits (1) to (4) described above are achieved. In addition, this embodiment of the invention also has the following effect.

(6) Because the ribs 265 and 275 are straight and the cam members 260 and 270 are driven in a straight line, a rotary shaft is not needed and the cam members 260 and 270 can be easily manufactured.

Embodiment 4

A lens unit 310 according to a fourth embodiment of the present invention is described next with reference to FIGS. 11–19.

This lens unit 310 differs from the lens unit 10 of the first embodiment in the location and structure of the cam members 360 and 370 in the drive apparatus 1. These differences are described in detail below.

Figure 11:
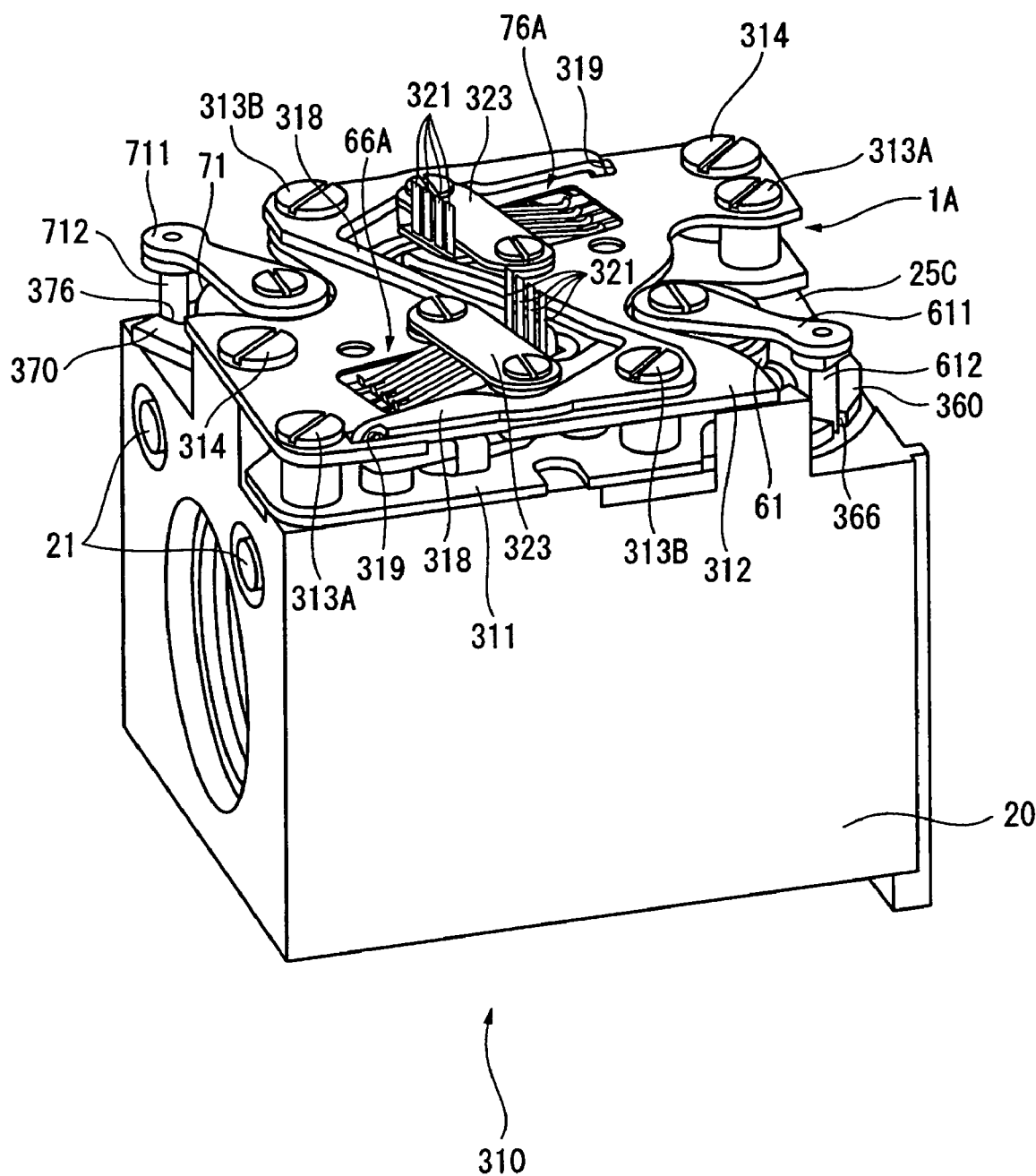
FIG. 11 is an oblique view of a lens unit according to a fourth embodiment of the present invention.

FIG. 11 is an oblique view of a lens unit 310 according to a fourth embodiment of the present invention. As shown in FIG. 11, this lens unit 310 has a cam member 370 for moving the first lens 30 (see FIG. 13), and another cam member 360 for moving the second lens 40 and third lens 50 (see FIG. 13). Unlike in the first embodiment, these cam members 360 and 370 are both disposed on the outside surface of the frame 20 closest to the guide shafts 21 (that is, the bottom surface as seen in FIG. 1 and the top as seen in FIG. 11). More specifically, these cam members 360 and 370 are disposed in the same plane on surface 25C, which is the side near the guide shafts 21 and parallel to the plane defined by the guide shafts 21.

The rotary shafts 61, 71 and oscillators 66 and 76 for rotationally driving the rotary shafts 61, 71 are disposed on the top surface of cam members 360 and 370 on an intervening bottom plate 311. A top plate 312 is further disposed above the rotary shafts 61, 71 and oscillators 66 and 76. A drive unit 1A is thus formed by fastening rotary shafts 61, 71 and oscillators 66 and 76 between bottom plate 311 and top plate 312 by means of screws 313 (313A, 313B). The top plate 312 is fastened to the frame 20 by means of screws 314, thereby fixing this drive unit 1A to the frame 20.

Figure 12:
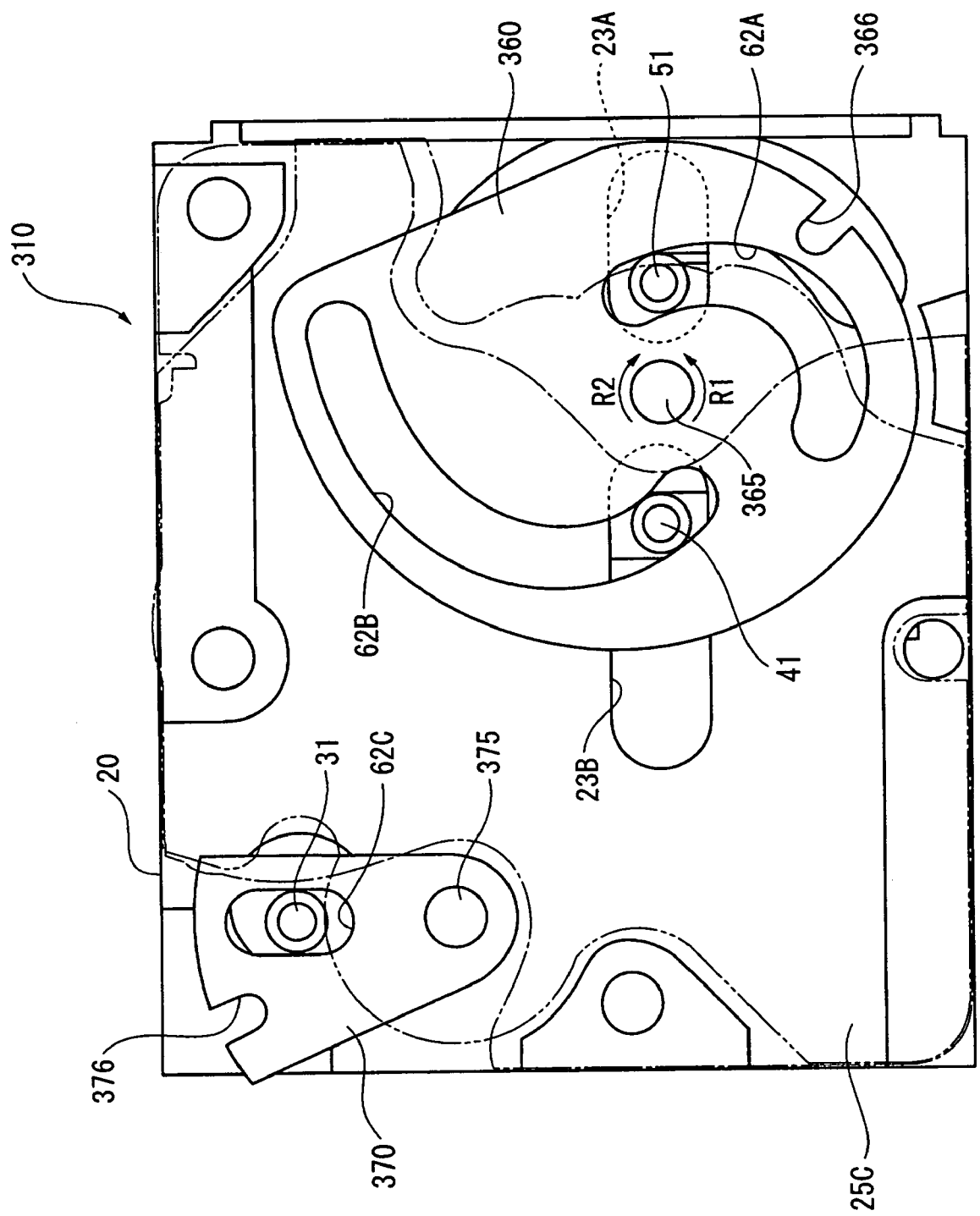
FIG. 12 is a plan view showing the arrangement of the cam members in the fourth embodiment of the invention.

FIG. 12 is a plan view showing the arrangement of the cam members 360 and 370. As shown in FIG. 12, this cam member 360 has a pivot pin 365 disposed at the center of rotation, and cam channels 62A and 62B rendered around this pivot pin 365. This pivot pin 365 is fit into a hole (not shown in the figure) formed in surface 25C, thus rendering the cam member 360 pivotably to the frame 20.

The cam channels 62A and 62B are formed in a spiral shape so that each channel gradually moves farther from the pivot pin 365. As a result, the outside profile of the cam member 360 is also spiral shaped following the cam channels 62A and 62B so that the outside edge of the cam member 360 becomes gradually farther from the pivot pin 365. The cam pin 51 of the third lens 50 and the cam pin 41 of the second lens 40 are inserted respectively into cam channels 62A and 62B. Channels 23A and 23B are also formed in the surface 25C parallel to the direction of second lens 40 and third lens 50 movement, that is, parallel to the guide shafts 21.

A substantially semicircular notch 366 is formed in the outside edge of the cam member 360.

Cam member 370 is fan-shaped, and has a pivot pin 375 disposed at the angle of cam member rotation, and an oval cam channel 62C. The pivot pin 375 fits in a hole (not shown in the figure) formed in surface 25C, thus enabling the cam member 370 to pivot on the frame 20. The cam pin 31 of the first lens 30 is fit in the cam channel 62C. A substantially semicircular notch 376 is also formed in the outside edge of the cam member 370.

Cam member 360 and cam member 370 are disposed at diagonally opposite corner ends of the substantially rectangular surface 25C.

Figure 13:
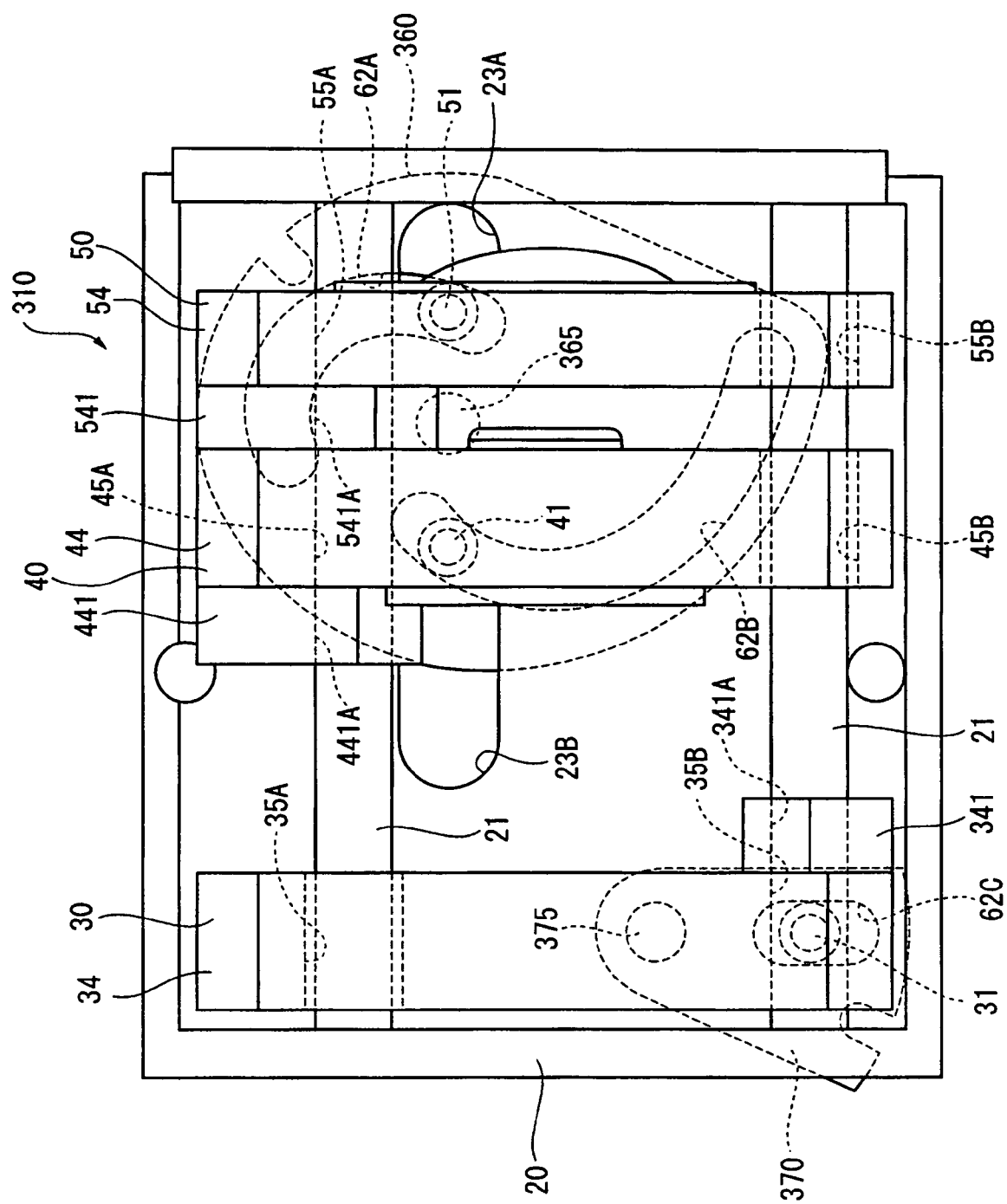
FIG. 13 shows how the lenses are mounted to the guide shafts in the fourth embodiment of the invention.

FIG. 13 shows how the first lens 30, second lens 40, and third lens 50 are mounted to the guide shafts 21. As shown in FIG. 13, the guide shafts 21 pass through through-holes 35A, 35B, 45A, 45B, 55A, and 55B formed in the support frames 34, 44, and 54 of the first, second and third lenses 30, 40, and 50.

Of the through-holes 35A, 35B formed in the first lens 30, the through-hole closest to the pivot pin 375 of the cam member 370, that is, through-hole 35B positioned where the cam channel 62C of the cam member 370 is formed and closer to where the cam pin 31 is located, is a positioning hole for controlling the position of the first lens 30 relative to the guide shafts 21. The diameter of this through-hole 35B is sized with consideration for the diameter of the guide shaft 21 to allow the first lens 30 to move smoothly and without tilting. The other through-hole 35A is an oval so that the position of the first lens 30 can be adjusted and to absorb dimensional variation during manufacture.

Of the through-holes 45A, 45B in the second lens 40 and the through-holes 55A, 55B in the third lens 50, the holes closer to the pivot pin 365 in cam member 360, that is, through-holes 45A and 55A closer to the cam pins 41 and 51, are the positioning holes. The other through-holes 45B and 55B are ovals.

Thus positioning the lenses to the guide shaft 21 nearest the pivot pin 365, 375 or cam pin 31, 41, 51 improves the positioning precision of the lenses 30, 40, 50, reduces the moment acting on the lenses 30, 40, 50, and enables smooth operation.

Guide members 341, 441, 541 having through-holes 341, 441A, 541A are disposed on the surface of the support frame 34, 44, 54 at positions corresponding to holes 35B, 45A, 55A. The lenses 30, 40, 50 are guided by these holes 35B, 45A, 55A and through-holes 341, 441A, 541A on guide shafts 21, and the thickness of each lens 30, 40, 50 (that is, the dimension through the direction in which the lenses move) is increased by these guide members 341, 441, 541, thus positioning and guiding the lenses 30, 40, 50 more stably.

Figure 14:
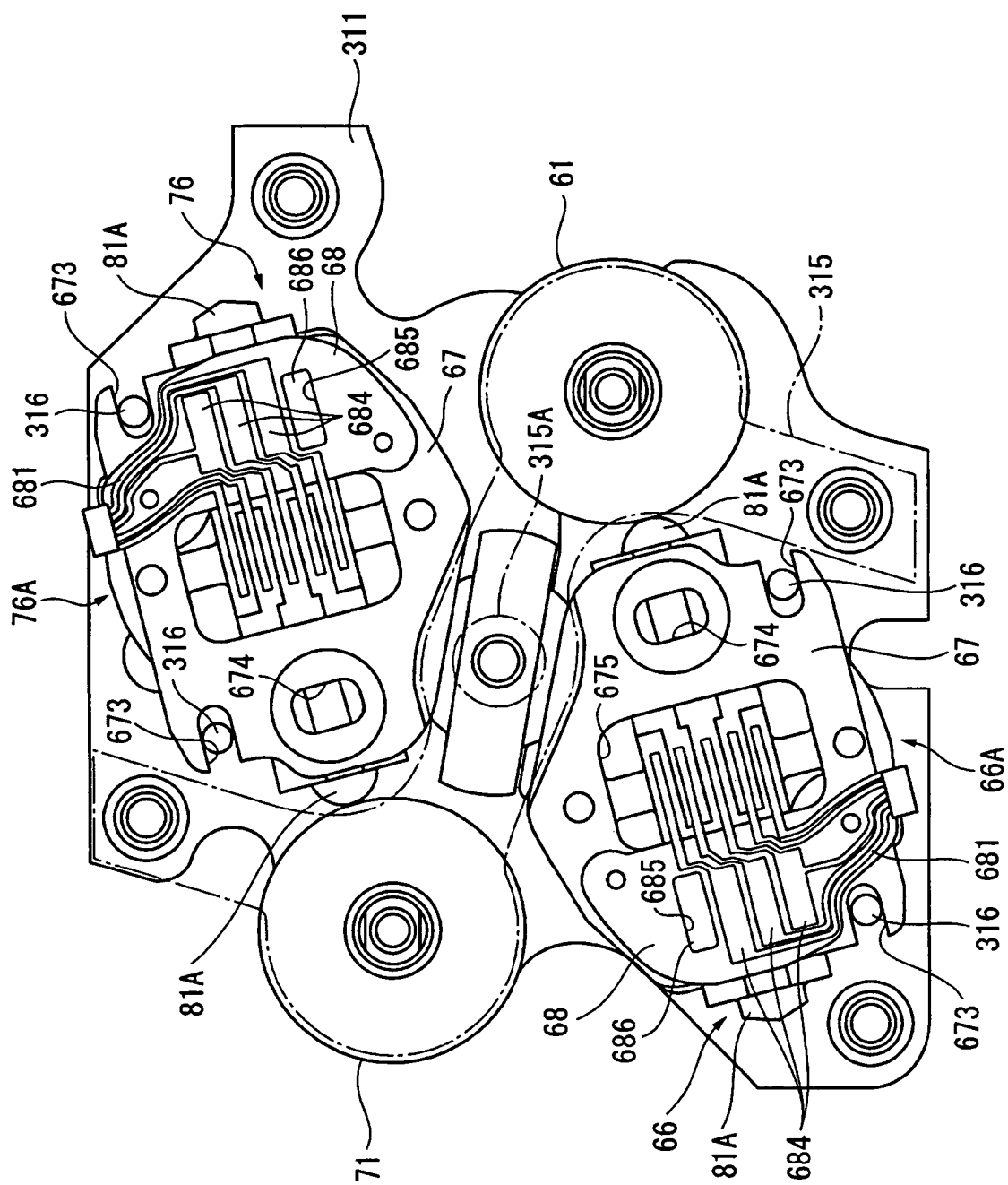
FIG. 14 is a plan view showing the arrangement of the rotary shafts and oscillators in the fourth embodiment of the invention.

FIG. 14 is a plan view showing the arrangement of the rotary shafts 61, 71 and oscillators 66 and 76. As shown in FIG. 14, the rotary shafts 61, 71 and oscillators 66 and 76 are mounted on the bottom plate 311. The rotary shafts 61, 71 are located concentrically to the pivot pins 365, 375 of the cam members 360 and 370, and the axis of rotation of the rotary shafts 61, 71 and the axis of rotation of the cam members 360 and 370 are thus the same. The rotary shafts 61, 71 are disposed between bearing plate 315, which is between the top plate 312 and rotary shafts 61, 71, and the bottom plate 311, and can thus rotate freely relative to the top plate 312 and bottom plate 311 and to the frame 20. This bearing plate 315 is fixed at approximately the center thereof to the bottom plate 311 by means of a screw 315A. Both ends of the bearing plate 315 are fixed in conjunction with top plate 312 to the bottom plate 311 by means of screws 313B.

As shown in FIG. 11, a lever member 611, 711 is fixed to each rotary shaft 61, 71. A pin 612, 712 disposed to the end of each of these lever members 611, 711 engages the notch 366, 376 formed in each cam member 360 and 370. As a result, when the rotary shafts 61, 71 turn, the lever members 611, 711 also turn, the pins 612, 712 push against the notches 366, 376, and the cam members 360 and 370 thus turn.

The oscillators 66 and 76 are formed as oscillator units 66A and 76A, which are disposed at diagonal positions on the surface 25C of the frame 20 and contacting rotary shafts 61, 71, respectively. The oscillator units 66A and 76A are identically structured, and therefore only oscillator unit 66A is described below.

Figure 15:
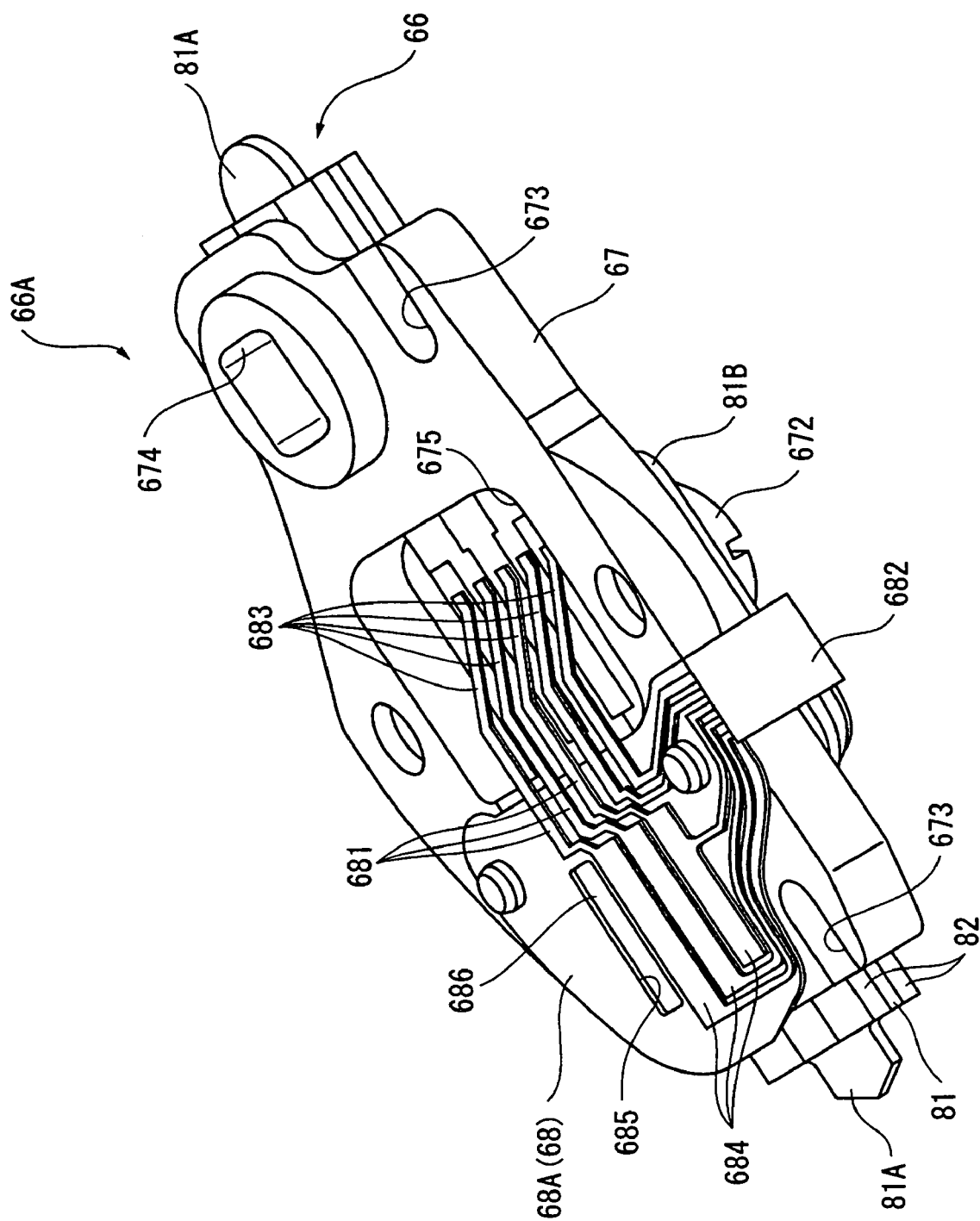
FIG. 15 is an oblique view of the oscillator unit in the fourth embodiment of the invention.
Figure 16:
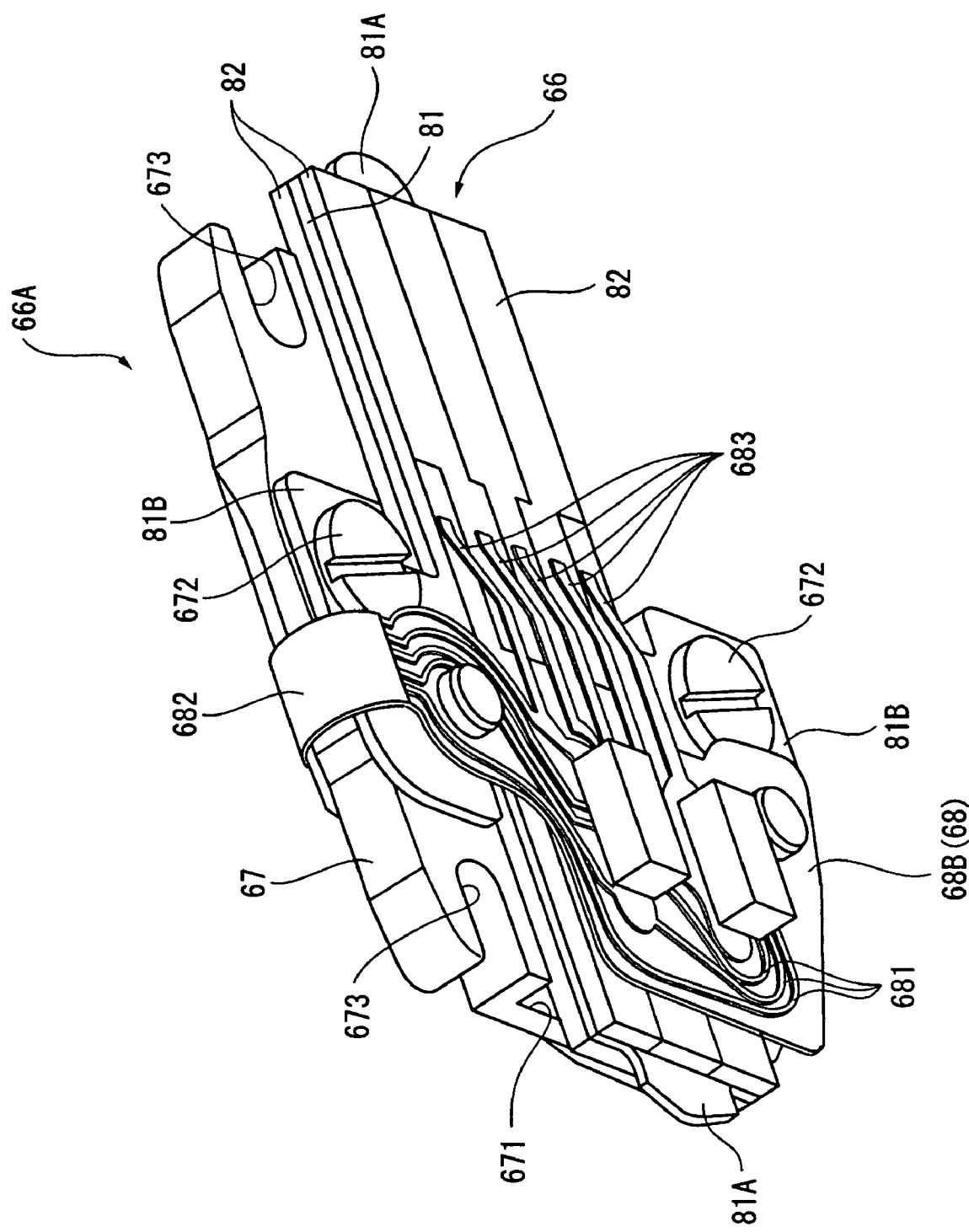
FIG. 16 is an oblique view of the oscillator unit in the fourth embodiment of the invention.

FIGS. 15 and 16 are oblique views of the oscillator unit 66A. As shown in FIG. 15 and FIG. 16, the oscillator unit 66A has an oscillator 66, a case 67 for holding the oscillator 66, and a circuit board 68 for connecting the electrodes 82A to 82E of the oscillator 66 assembled in the case 67 to an external voltage supply.

As described in the first embodiment, the oscillator 66 has piezoelectric elements 82 disposed on both sides of a reinforcing substrate 81, and a contact tip 81A is formed on both longitudinal ends of the reinforcing substrate 81, that is, in the center on the short sides of the reinforcing substrate 81. One contact tip 81A is substantially semicircular-shaped and contacts the side of rotary shaft 61 as shown in FIG. 14. The other contact tip 81A is polygonal-shaped.

Figure 17:
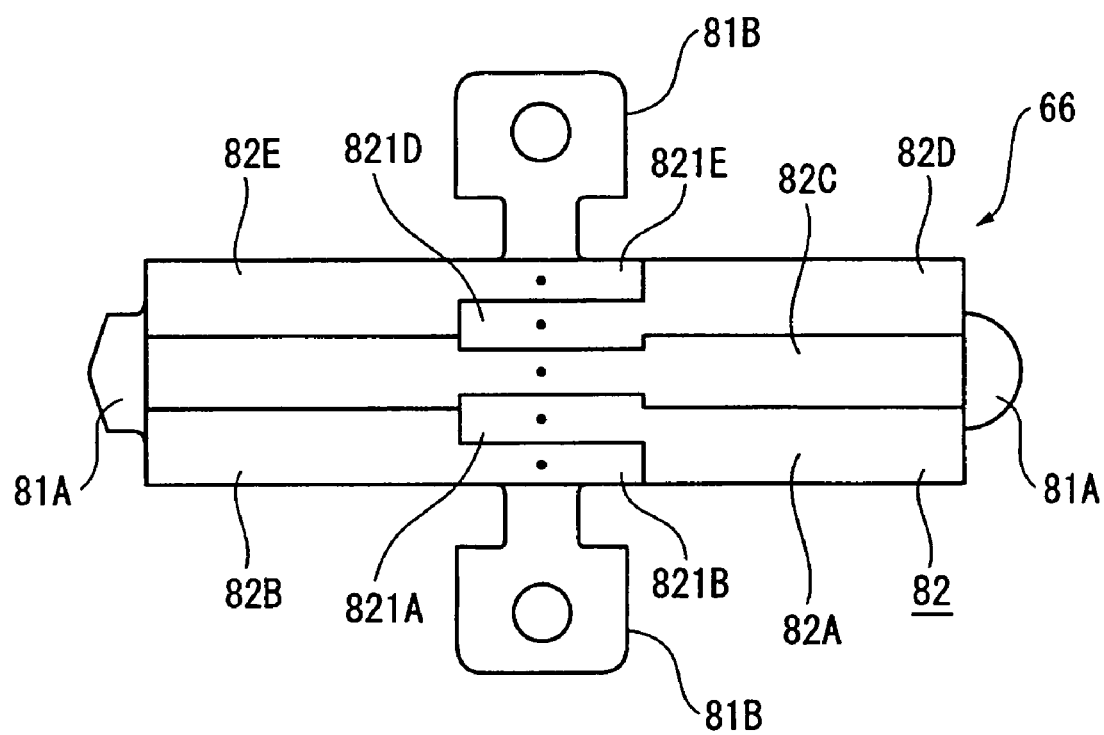
FIG. 17 is a plan view of the oscillator unit in the fourth embodiment of the invention.

FIG. 17 shows the electrode pattern of the oscillator 66. As shown in FIG. 17, the oscillator 66 has five electrodes 82A to 82E similarly to the oscillator 66 in the first embodiment. However, electrodes 82A, 82B, 82D, 82E each also have an electrode arm 821A, 821B, 821D, 821E extending longitudinally in approximately the middle of the piezoelectric element 82. These electrode arms 821A, 821B, 821D, 821E and the longitudinal middle of electrode 82C are connection nodes (terminals) for making a connection to the external voltage supply. Connection to the voltage supply is simplified by arranging these connection nodes on the electrode arms 821A, 821B, 821D, 821E and electrode 82C substantially in line across the width of the piezoelectric elements 82.

Referring again to FIG. 15 and FIG. 16, the case 67 is a block made of stainless steel or other conductive material. The case 67 is disposed to one side of the oscillator 66, and has a recess 671 on the side opposite the oscillator 66. The oscillator 66 is thus fit inside this recess 671 with arm members 81B fastened by screws 672 to the case 67. The longitudinal ends of the oscillator 66 project from the ends of the case 67, and the case 67 thus does not interfere with rotary shaft 61 operation when the contact tip 81A contacts the rotary shaft 61.

A deep notch 673 is formed in line with the longitudinal direction of the oscillator 66 at both longitudinal ends of the case 67. Both notches 673 are formed on the same side relative to the longitudinal axis of the oscillator 66. These notches 673 are provided so that when the oscillator unit 66A is assembled to the bottom plate 311, pins 316 projecting from the bottom plate 311 fit into the notches 673 (see FIG. 14), and the oscillator unit 66A can slide in a particular direction (that is, along the notches 673 lengthwise to the oscillator 66). A spring mounting hole 674 is also formed in the end portion of the case 67 near the rotary shaft 61 for installing a spring urging the oscillator 66 to the rotary shaft 61.

Circuit board 68 is preferably an insulated flexible circuit board having a wiring pattern 681 formed on the surface. The circuit board 68 is disposed on both sides of the oscillator 66, one circuit board 68A fixed to the side of the case 67 to which the oscillator 66 is not disposed, and the other circuit board 68B fixed on the recess 671 side of the case 67 with the oscillator 66 between the case 67 and the circuit board 68B. These circuit boards 68A and 68B are connected by an interconnecting portion 682.

The wiring pattern 681 is connected to the electrodes 82A to 82E of the piezoelectric elements 82 by means of leads 683 extending from the circuit board 68 and soldered to the electrodes. Note that the leads 683 hanging over from circuit board 68A are connected to the piezoelectric elements 82 through an opening 675 formed in the case 67.

The wiring pattern 681 provides conductivity between electrodes 82A and 82E, and electrodes 82B and 82D, and the interconnecting portion 682 provides conductivity between corresponding electrodes 82A to 82E in the piezoelectric elements 82 on opposite sides of the reinforcing substrate 81. Terminals 684 connected to each of electrodes 82A to 82E are also formed in the wiring pattern 681. More specifically, there are three terminals 684, one terminal connecting electrodes 82A and 82E on opposite sides of the reinforcing substrate 81, one terminal connecting electrodes 82B and 82D on opposite sides of the reinforcing substrate 81, and one terminal connecting electrodes 82C on opposite sides of the reinforcing substrate 81. These terminals 684 are substantially rectangular, and are arranged with the longitudinal axis of the terminals in the longitudinal axis of the piezoelectric elements 82.

An elongated hole 685 is formed in circuit board 68A, and the surface of the case 67 is exposed through this hole 685. Because the case 67 is made from a conductive material, conductivity is established between the surface of case 67 and the reinforcing substrate 81 in this hole 685. The surface of the case 67 inside this hole 685 therefore functions as a terminal 686 connected to the reinforcing substrate 81.

These oscillator units 66A and 76A and the rotary shafts 61, 71 are disposed symmetrically to a common point on the surface 25C of the frame 20 as shown in FIG. 14, and are covered by top plate 312.

Figure 18:
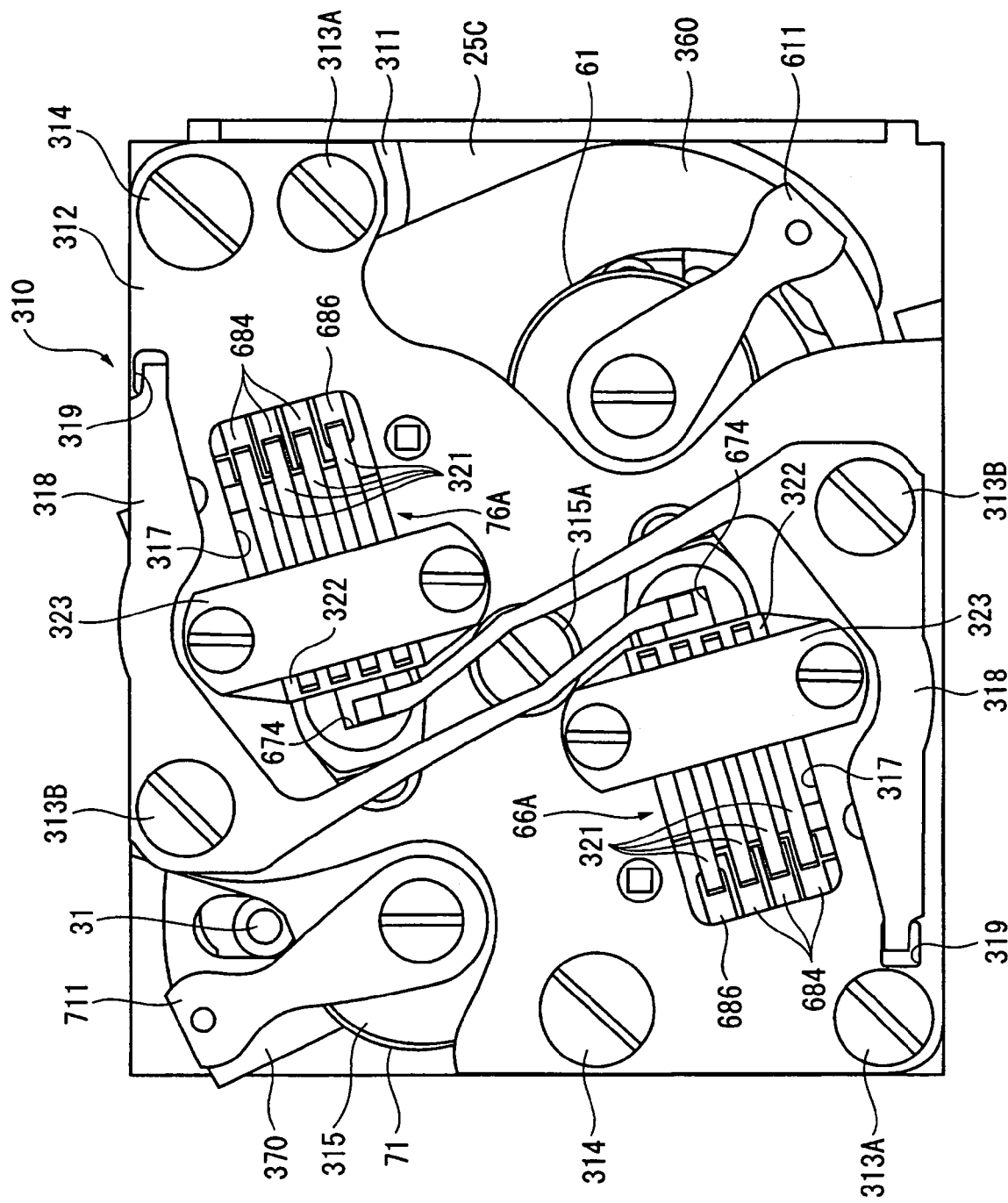
FIG. 18 is a plan view of the drive unit in the fourth embodiment of the invention.

FIG. 18 is a plan view of the drive unit 1A. As shown in FIG. 18 and FIG. 11, openings 317 are formed in the top plate 312 where the oscillator units 66A and 76A are positioned. The terminals 684 and 686 of the oscillator units 66A and 76A, and the spring mounting hole 674 are exposed through these openings 317.

Springs 318 for urging the oscillator units 66A and 76A to the rotary shafts 61, 71 are mounted to the top plate 312. These springs 318 are substantially L-shaped flat members fastened to the top plate 312 by a screw 313 at the elbow substantially in the middle of the spring. One end of each spring 318 is inserted to a hole 319 formed in the top plate 312. The other end of each spring 318 passes through the opening 317 and is inserted to the corresponding spring mounting hole 674 in the oscillator units 66A and 76A.

The distance between hole 319 and spring mounting hole 674 is greater than the distance between the ends of the spring 318. The springs 318 are thus inserted to holes 319 and spring mounting holes 674 with the ends of the springs spread apart. As a result, the springs 318 exert force in the direction urging the spring ends together. As noted above, the oscillator units 66A and 76A are disposed so as to slide lengthwise on notches 673 and pins 316, and springs 318 thus urge the oscillator units 66A and 76A toward the rotary shafts 61, 71. As a result, the contact tips 81A are pressed with appropriate force to the sides of the rotary shafts 61, 71.

Note that the spring 318 for urging the oscillator unit 66A is disposed near oscillator unit 76A, the spring 318 for urging the oscillator unit 76A is disposed near the oscillator unit 66A, and the springs 318 are disposed substantially symmetrically to a common point on the surface 25C. Sufficient spring 318 length can thus be assured, spring force can be easily adjusted, and the desirable force can thus be easily exerted by each spring 318.

A connection terminal 321 connected to the external voltage supply is disposed to each terminal 684, 686 of the oscillator units 66A and 76A.

Figure 19:
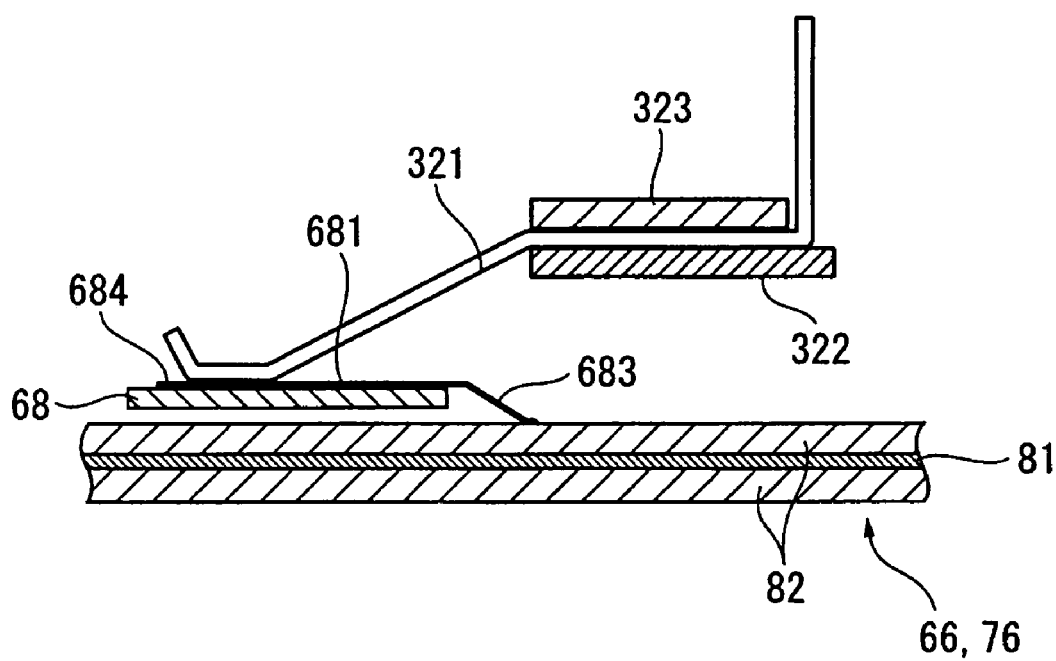
FIG. 19 is a side sectional view of the connection terminals in the fourth embodiment of the invention.

FIG. 19 is a side section view of the connection terminals 321. As shown in FIG. 19, FIG. 11, and FIG. 18, the connection terminals 321 are conductive finger-like members equal in number (four in this embodiment of the invention) to terminals 684, 686. As shown in FIG. 19, the four connection terminals 321 are fixed each at approximately the middle thereof to a mounting member 322 made from a dielectric material. One end of each connection terminal 321 is inclined to the oscillator units 66A and 76A with the distal ends thereof touching the terminals 684, 686 of the circuit board 68. The ends of the connection terminals 321 and the terminals 684, 686 can slide together because the ends of the connection terminals 321 only contact the terminals 684, 686 and are not fixed thereto.

The other end of each connection terminal 321 is bent substantially perpendicularly to the surface of the oscillator units 66A and 76A, and protrudes from the top plate 312. A lead is connected to this other end of each connection terminal 321, and these leads are connected to the external voltage supply.

A pressure plate 323 pressing the connection terminals 321 to the oscillators 66 and 76 is disposed opposite the mounting member 322 with the connection terminals 321 therebetween. This pressure plate 323 is made from a dielectric material, and is disposed spanning the opening 317 in the top plate 312 with both ends of the pressure plate 323 screwed to the top plate 312. The pressure plate 323 thus presses the connection terminals 321 and mounting member 322 to the oscillators 66 and 76 with the ends of the connection terminals 321 pressed with appropriate force against the terminals 684, 686 of the circuit board 68.

When the external voltage supply applies a voltage to the appropriately selected connection terminals 321 in this lens unit 310, the voltage is applied to the corresponding electrodes 82A to 82E of the piezoelectric elements 82. The oscillators 66 and 76 are thus excited and vibrate reciprocally in longitudinal and bending oscillation modes, thereby causing the contact tip 81A to oscillate in an elliptical path. This elliptical path causes the rotary shafts 61, 71 to rotate, and the lever members 611, 711 thus also rotate.

When the lever members 611, 711 rotate, the cam members 360 and 370 also turn. When the cam member 360 rotates counterclockwise from the position shown in FIG. 12 in the direction of arrow R1, the distance from the pivot pin 365 to the cam pins 41 and 51 in the cam channels 62A and 62B increases as the cam member 360 turns because the cam channels 62A and 62B form a spiral. The cam pins 41 and 51 thus travel along the cam channels 62B and 62A, and the second lens 40 and third lens 50 move away from each other. Conversely, when the cam member 360 turns clockwise in the direction of arrow R2 in FIG. 12, the second lens 40 and third lens 50 move closer together.

In addition, when the oscillator 76 drives the rotary shaft 71 counterclockwise from the position shown in FIG. 12, the cam pin 31 of cam member 370 likewise travels inside the cam channel 62C, and the first lens 30 thus moves.

In addition to the benefits (1) to (4) of the first embodiment described above, this fourth embodiment of the invention also provides the following benefits.

(7) As described above, the cam channels 62A and 62B of the cam member 360 form a spiral around the pivot pin 365. As a result, unlike the fan-shaped cam member 60 in the first embodiment, the length of a line between the cam channels 62A and 62B and the pivot pin 365 determines the distance between the second lens 40 and third lens 50. More specifically, because the cam pins 41 and 51 in the cam channels 62A and 62B can be positioned in a line with the rotary shaft 61, the outside shape of the cam member 360 can be an ellipse or a near circle following the shape of the spiral, and the size of the cam member 360 can therefore be reduced.

Furthermore, while the cam members are located on both sides of the frame 20 in the first embodiment, configuring the cam channels 62A and 62B and cam member 360 as described in the present embodiment enables locating both cam members 360 and 370 on the same one surface 25C of the frame 20. As a result, the lens unit 310 can also be made smaller.

Yet further, disposing the rotary shafts 61, 71 at diagonally opposite ends of the substantially rectangular surface 25C affords using the space on the surface 25C more efficiently.

(8) A drive unit 1A is formed by disposing the rotary shafts 61, 71 and oscillator units 66A and 76A between a bottom plate 311 and top plate 312, and the cam members 360 and 370 and rotary shafts 61, 71 are separate. As a result, the efficiency of driving the rotary shafts 61, 71 by means of vibrations from the oscillators 66 and 76 in the drive unit 1A can be verified, and the movement of the lenses 30, 40, 50 due to rotation of the cam members 360 and 370 can be separately verified. The characteristics of the oscillator units 66A and 76A and the characteristics of the cam members 360 and 370 can therefore be separately optimized, and more efficient drive performance can therefore be more reliably achieved.

Furthermore, lens unit 310 maintenance is improved because only the malfunctioning part can be replaced if a problem occurs in either the cam members 360 and 370 or the oscillator units 66A and 76A.

(9) Circular motion of the rotary shafts 61, 71 can be transferred through the lever members 611, 711 because the lever members 611, 711 are disposed between the rotary shafts 61, 71 and the cam members 360 and 370. The lever members 611, 711 can therefore be arranged to prevent interference with the cam channels 62A, 62B, 62C, and the cam members 360 and 370 can be reliably driven.

Furthermore, offset between the center of rotation of the rotary shafts 61, 71 and the center of rotation of the cam members 360 and 370 can be absorbed to a degree by the lever members 611, 711 as a result of connecting the rotary shafts 61, 71 and cam members 360 and 370 by means of the lever members 611, 711. Precisely controlling the positioning precision of these axes of rotation is therefore unnecessary, and the lens unit 310 can be easily manufactured.

Yet further, the effect of play in the connection between the rotary shafts 61, 71 and cam members 360 and 370 on the angle of cam member rotation is minimized as a result of connecting the rotary shafts 61, 71 and cam members 360 and 370 by intervening lever members 611, 711. The cam members 360 and 370 can thus be driven rotationally with even greater precision.

(10) The manufacturing cost of the lens unit 310 can be reduced because the oscillators 66 and 76 are rendered as identical oscillator units 66A and 76A and parts can thus be shared.

Furthermore, because the oscillator units 66A and 76A are assembled slidably to the bottom plate 311 and are urged to the rotary shafts 61, 71 by springs 318, the contact tips 81A can be pressed with appropriate force to the rotary shafts 61, 71 even if the contact tips 81A wear slightly due to use over a long period of time, and good drive force can therefore be assured.

Furthermore, because the connection terminals 321 are pressed in contact with the terminals 684, 686 and can slide against the terminals 684, 686, good, positive contact can be assured between the terminals 684, 686 and connection terminals 321 even when the oscillators 66 and 76 vibrate. Broken leads and interrupted connections can thus be prevented.

Furthermore, positive contact between the terminals 684, 686 and connection terminals 321 is still assured even when the contact tips 81A wear slightly and the oscillator units 66A and 76A slide towards the rotary shafts 61, 71.

Because the connection terminals 321 are simply pressed against the terminals 684, 686, the connection terminals 321 and terminals 684, 686 can be easily disconnected. The oscillator units 66A and 76A can therefore be replaced on the top plate 312, and the lens unit 310 is therefore easier to maintain.

(11) The torque load needed to drive the lenses 30, 40, 50 can be minimized because the distance from the cam pins 31, 41, 51 to the guide shafts 21 is minimized as a result of the cam members 360 and 370 being disposed on the surface 25C nearest the guide shafts 21. The lenses 30, 40, 50 can thus be moved smoothly using little drive force, and less energy is therefore required to operate the lens unit 310.

(12) The guide shaft through-holes that are closest to the pivot pins 365, 375 of the cam members 360 and 370 in each lens 30, 40, 50, that is, the guide shaft 21 through-holes 35B, 45A, 55A closest to the cam pins 31, 41, 51, are positioning pins for positioning the lenses 30, 40, 50 on the guide shafts 21. The cam pins 31, 41, 51 can therefore be accurately positioned to the cam members 360 and 370, and smooth lens 30, 40, 50 movement can therefore be achieved.

Furthermore, because guide members 341, 441, 541 are disposed at the through-holes 35B, 45A, 55A used as positioning holes, the thickness of each lens 30, 40, 50 and the length of each through-hole 35B, 45A, 55A can be increased, and each lens 30, 40, 50 can therefore be moved with even greater stability.

Various embodiments, including a best mode, of the present invention are described above. However, the present invention is not limited to these embodiments.

For example, the lens unit 10, 110, 210, 310 in each of the foregoing embodiments is not limited to having lenses 30, 40, 50. A lens unit according to the present invention could comprise an imaging device (not shown in the figure) for converting an image formed by a lens to an electric signal. More specifically, a charge-coupled device (CCD) could be used as an imaging device in place of the second lens 40. In this case, the CCD can be positioned to the focal point of the first lens 30 by operating the drive mechanism as described above, and the image formed by the first lens 30 can be captured by the CCD. The third lens can be omitted in this case.

Alternatively, a CCD could be fixed at one end of the frame 20, 90 to capture images formed by the lenses 30, 40, 50.

While the rotary shafts and cam members are connected by lever members in the foregoing fourth embodiment, the rotary shafts and cam members could, alternatively, be removably assembled by extending the rotary shaft (pivot pin) of one of the cam members, inserting the extension in a hole formed at the center of rotation of the other shaft (pin), and thereby connecting the shafts (pins) and cam members to each other. Rotation of the rotary shafts due to vibration from the oscillators, and movement of the lenses due to rotation of the cam members, can thus still be separately verified, thereby assuring desirable performance.

In addition to driving focusing and zoom lenses in a control device, the present invention can also be used for driving a focusing lens and zoom lens in a cell phone equipped with a camera function, that is, in a cell phone camera.

Moreover, the invention is not limited to driving lens assemblies. For example, the invention could be used to drive the head arm in a card-type hard disk such as used in compact or handheld information devices.

As previously noted, while various embodiments, including a best mode, of the present invention are described above, the present invention is not limited to these embodiments. Specific descriptions of shapes, materials, and other aspects of the invention in the foregoing embodiments are offered by way of example to facilitate understanding the present invention, not to limit the invention. Various modifications to the shape, materials, quantities, and other details of the foregoing embodiments will be apparent to one skilled in the related art, and these modifications are part of the invention to the extend they fall within the scope of the appended claims.

What is claimed is:

1. A drive apparatus, comprising:
an oscillator adapted to oscillate in response to deformation of a piezoelectric element wherein the oscillator has an oscillation mode that is a combination of reciprocal oscillation and bending oscillation and that causes a contact portion of the oscillator to trace an elliptical path; and a cam member that is directly contacted by the oscillator and moves in response to oscillation of the oscillator;

wherein the cam member has at least one drive guide member formed therein adapted to engage a driven member and cause the driven member to move reciprocally.

2. A drive apparatus as recited in claim 1, wherein the cam member has two drive guide members, each formed in a spiral segment around the axis of rotation of the cam member.

3. A drive apparatus as recited in claim 1, further comprising a rotary shaft removably assembled to the cam member and contacted by the oscillator, wherein the cam member rotates in conjunction with rotation of the rotary shaft.

4. A drive apparatus as recited in claim 3, further comprising a lever member fixed to, and projecting radially from, the rotary shaft, wherein the axis of rotation of the rotary shaft and the axis of rotation of the cam member are the same, and a distal end portion of the lever member engages the cam member.

5. A drive apparatus as recited in claim 2, wherein the driven member is housed in a frame having a plurality of side surfaces, the drive apparatus further comprising a plurality of cam members and a plurality of associated oscillators disposed on the same side surface of the frame.

6. A drive apparatus as described in claim 5, wherein the plurality of cam members and plurality of associated oscillators are disposed symmetrically with respect to a point on the same side surface.

7. A drive apparatus as described in claim 1, wherein the cam member moves in a line in response to oscillation of the oscillator, the cam member having a relatively straight rib formed in a line following the direction of cam member movement, and the oscillator contacts the rib.

8. A drive apparatus as described in claim 1, wherein the oscillation direction of the oscillation mode tracing an elliptical path can be changed.

9. A drive apparatus as recited in claim 1, further comprising at least two guide shafts for guiding reciprocal movement of the driven member, wherein the driven member is positioned on the guide shaft closer to the cam member.

10. A drive apparatus as recited in claim 1, further comprising at least two guide shafts for guiding reciprocal movement of the driven member, wherein the cam member is disposed proximally to the guide shafts.

11. A drive apparatus, comprising:

an oscillator adapted to oscillate in response to deformation of a piezoelectric element; and a cam member that comprises:

a rotary shaft having an outside surface that is contacted by the oscillator and moves in response to oscillation of the oscillator; and a drive guide member formed within the cam member adapted to engage a driven member; and the rotary shaft has a rib formed in a radial arc with respect to the axis of rotation of the cam member, and the oscillator contacts the rib.

12. The drive apparatus as recited in claim 1 incorporated into a lens unit wherein further comprising a frame to which the drive apparatus is attached.

13. The lens unit as recited in claim 12 wherein the driven member includes a lens.

14. The lens unit as recited in claim 12, wherein a lens is mounted in the frame, and the driven member includes an imaging device for converting an image formed by the lens to an electrical signal.

15. The lens unit as recited in claim 12, wherein a lens in the lens unit is a zoom lens or a focusing lens.

16. The drive apparatus as recited in claim 1 incorporated into a camera, comprising:

a lens;

a recording medium for recording an image formed by the lens;

wherein the driven member includes one or both of the group consisting of the lens and the recording medium; and a case in which the drive apparatus, lens, and recording medium are housed.

* * * * *